(12) United States Patent
Chen

(10) Patent No.: US 6,414,848 B1
(45) Date of Patent: Jul. 2, 2002

(54) CPU RADIATOR ASSEMBLY

(76) Inventor: Jack Chen, 3F, No. 4, Alley 26, Lane 268, Fu-te St., Taipei (TW)

( * ) Notice: Subject to any disclaimer, the term of this patent is extended or adjusted under 35 U.S.C. 154(b) by 0 days.

(21) Appl. No.: 09/915,373

(22) Filed: Jul. 27, 2001

(30) Foreign Application Priority Data

Jul. 6, 2001 (TW) .......................................... 090211442

(51) Int. Cl.⁷ ................................................. H05K 7/20
(52) U.S. Cl. ...................... 361/704; 248/510; 165/185; 257/719; 361/695; 361/719
(58) Field of Search ................................ 248/505, 510; 257/718, 719, 726, 727; 174/16.3; 454/184; 164/121–126, 80.3, 185; 361/687, 695–697, 704, 705, 709–712, 717–719

(56) References Cited

U.S. PATENT DOCUMENTS

| | | | | |
|---|---|---|---|---|
| 5,771,155 A | * | 6/1998 | Cook | 361/710 |
| 5,791,403 A | * | 8/1998 | Chiou | 165/80.3 |
| 6,012,510 A | * | 1/2000 | Cook | 165/80.3 |
| 6,201,697 B1 | * | 3/2001 | McCullough | 361/704 |
| 6,286,586 B2 | * | 9/2001 | Cook | 165/80.3 |

* cited by examiner

*Primary Examiner*—Gerald Tolin
(74) *Attorney, Agent, or Firm*—Bacon & Thomas, PLLC

(57) ABSTRACT

A CPU radiator assembly includes an upper frame, a lower frame, a radiator block interposed between the upper and the lower frames, a pressing member extending across the radiator block and having a connecting end connected to the upper frame and a free end, and a control bar mounted on the upper frame to selectively apply a downward force on the free end of the pressing member and thereby push the radiator block and the lower frame downward in opposite to the upper frame, making the upper frame firmly grip the lower frame and the radiator block tightly contact the CPU below it. Fixed and movable legs having hooked lower ends connect the upper frame to the lower frame. The movable legs are pivotally turnable to disengage the hooked lower ends from the lower frame, so that the CPU radiator assembly could be easily assembled or disassembled.

49 Claims, 27 Drawing Sheets

CPU RADIATOR ASSEMBLY

FIELD OF THE INVENTION

The present invention relates to a CPU radiator assembly, and more particularly to a CPU radiator assembly that could be easily assembled and handled to enable secure and tight contact of a radiator block with the CPU and accordingly excellent radiating effect.

BACKGROUND OF THE INVENTION

In a conventional radiator assembly for radiating heat produced by a central processing unit (CPU) during operation, there is an upper and a lower frame connected to each other through hooking means. Since there is not any means provided to pull the upper and the lower frames in two opposite directions, the two frames are often in a loosely connected state, and a radiator block disposed between the two frames fails to tightly contact with the CPU located below it. Air existing in any clearance between the radiator block and the CPU has adverse influence on good thermal conductivity of the radiator block and prevents heat produced by the CPU from being quickly and effectively radiated to cool the CPU. In a worse condition, the CPU would even become burned-out. CPU has been highly developed and CPU above 1 G has long become a main stream in the related industrial field. While the highly developed CPU processes data at a much higher speed, it produces more heat during operation. If the radiator block does not tightly contact with the CPU and results in poor radiation efficiency, it is very possible the CPU would burn out and even destruct other adjacent circuits or chips.

Moreover, since the upper and the lower frames of the conventional CPU radiator assembly are connected through hooking means, they could be disassembled from each other only by hands to pull out the hooking means. Therefore, the conventional CPU radiator assembly could not be inconveniently handled.

Further, the conventional CPU radiator assembly includes a radiator fan that is fastened to the upper frame by screws and therefore causes inconvenience in handling the CPU radiator assembly, too.

SUMMARY OF THE INVENTION

A primary object of the present invention is to provide a CPU radiator assembly, of which an upper and a radiator block are subjected to two forces in opposite directions and thereby enables secure connection of the upper frame to a lower frame below the radiator block and tight contact of the radiator block with the CPU to ensure largely upgraded radiating efficiency.

Another object of the present invention is to provide a CPU radiator assembly, of which an upper and a lower frame are connected through fixed and movable legs having upper ends connected to the upper frame and lower ends provided with retaining hooks for engaging into hook holes provided on the lower frame. By pushing a movable lip member connecting the movable legs relative to a fixed lip member on the upper frame, the movable legs may be pivotally turned to easily disengage the hooked lower ends from the hook holes on the lower frame and thereby separate the upper and the lower frames from each other.

A further object of the present invention is to provide a CPU radiator assembly, of which an upper and a radiator block are subjected to two forces in opposite directions simply through provision of a pressing member pivotally connected at an end to the upper frame and pressing a bottom central protrusion against the radiator block, and thereby enables secure connection of the upper frame to a lower frame and tight contact of the radiator block with the CPU to ensure largely upgraded radiating efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
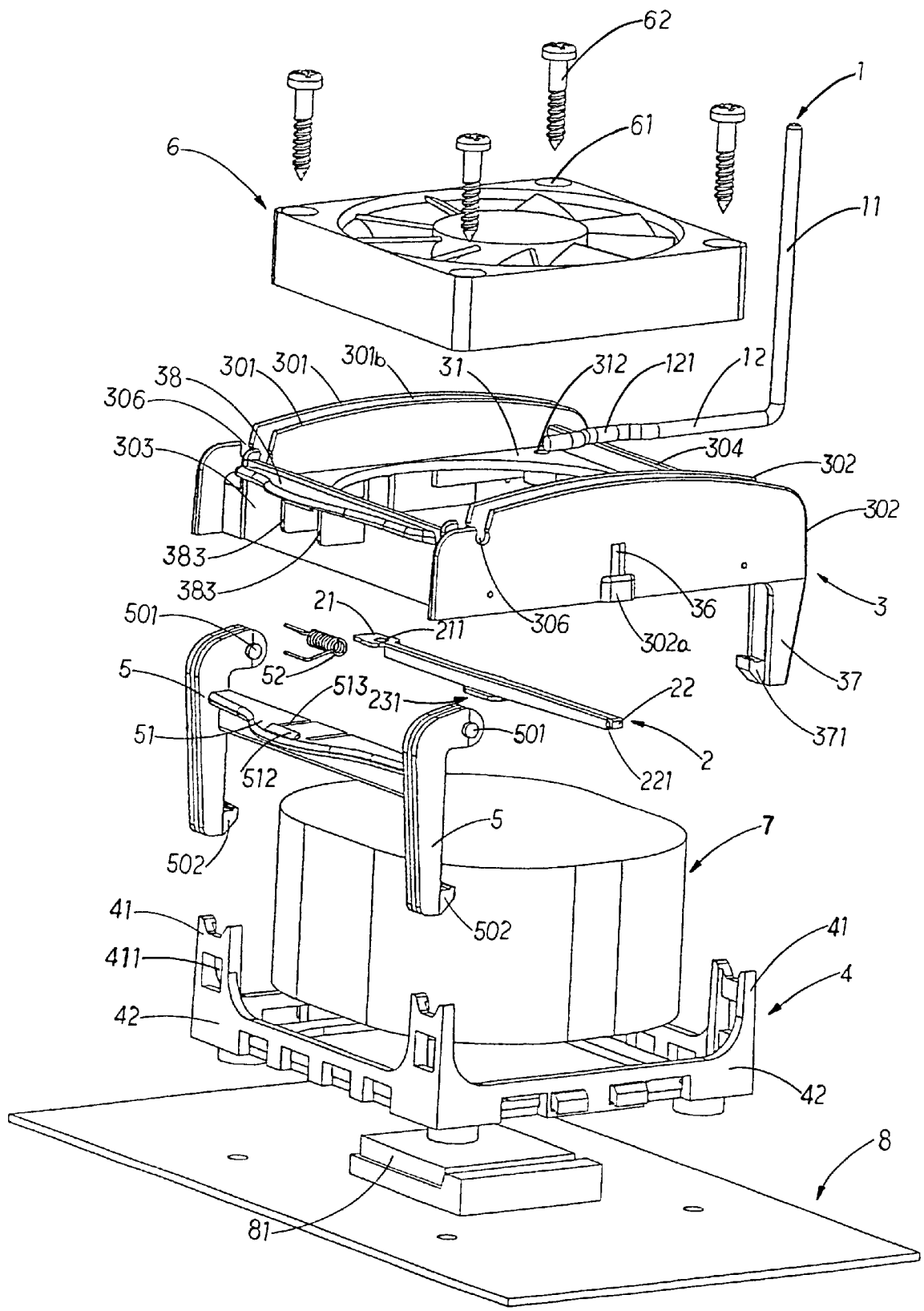
FIG. 1 is an exploded perspective view of a CPU radiator assembly according to the present invention.

Please refer to FIG. 1. A radiator assembly according to the present invention for a central processing unit (CPU) includes three major aspects and a secondary aspect. The first major aspect mainly involves a control bar 1 and a pressing member 2 that are configured to subject an upper frame 3 and a radiator block 7 to two forces in opposite directions. The second major aspect mainly involves a pair of pivotally movable second legs 5, a movable lip member 51 connected to and transversely extended between the pair of second legs 5, and a fixed lip member 38 provided on the upper frame 3 to enable easy separation of the upper frame 3 from a lower frame 4. The third major aspect mainly involves a radiator fan 6, the upper frame 3, the pressing member 2, the radiator block 7, the lower frame 4, and a circuit board 8 having a CPU 81 fixedly mounted thereon, wherein the pressing member 2 alone is sufficient to subject the upper frame 3 and the radiator block 7 to two forces in opposite directions. And, the secondary aspect mainly involves a pair of elastic retainers 9 that enables easy securing of the radiator fan 6 to the upper frame 3 without using screws.

As can be seen in FIG. 1, the CPU 81 is plugged onto a CPU seat that is then fixedly mounted on the circuit board 8, and the radiator fan 6 is fixed to a central mounting board 31 of the upper frame 3, which is a hollow member, by means of screws 62 or other similar means. The upper frame 3 is detachably connected to the lower frame 4, which is also a hollow member, by means of a pair of first legs 37 and a pair of second legs 5. The radiator block 7 is interposed between the upper and the lower frames 3, 4 with a bottom side of the radiator block 7 in contact with the CPU 81 due to the hollow configuration of the lower frame 4, such that heat produced by the CPU 81 during operation is transmitted to the radiator block 7 and radiated therefrom. The lower frame 4 is fixedly mounted onto the circuit board 8 in an acceptable manner known in the art that is not shown in FIG. 1, such that the CPU 81 is centered at a hollow bottom of the lower frame 4. The radiator fan 6 sends cool air to pass the hollow upper frame 3 and reach the radiator block 7, so as to cool the radiator block 7 that collects heat produced by the CPU 81.

Figure 11:
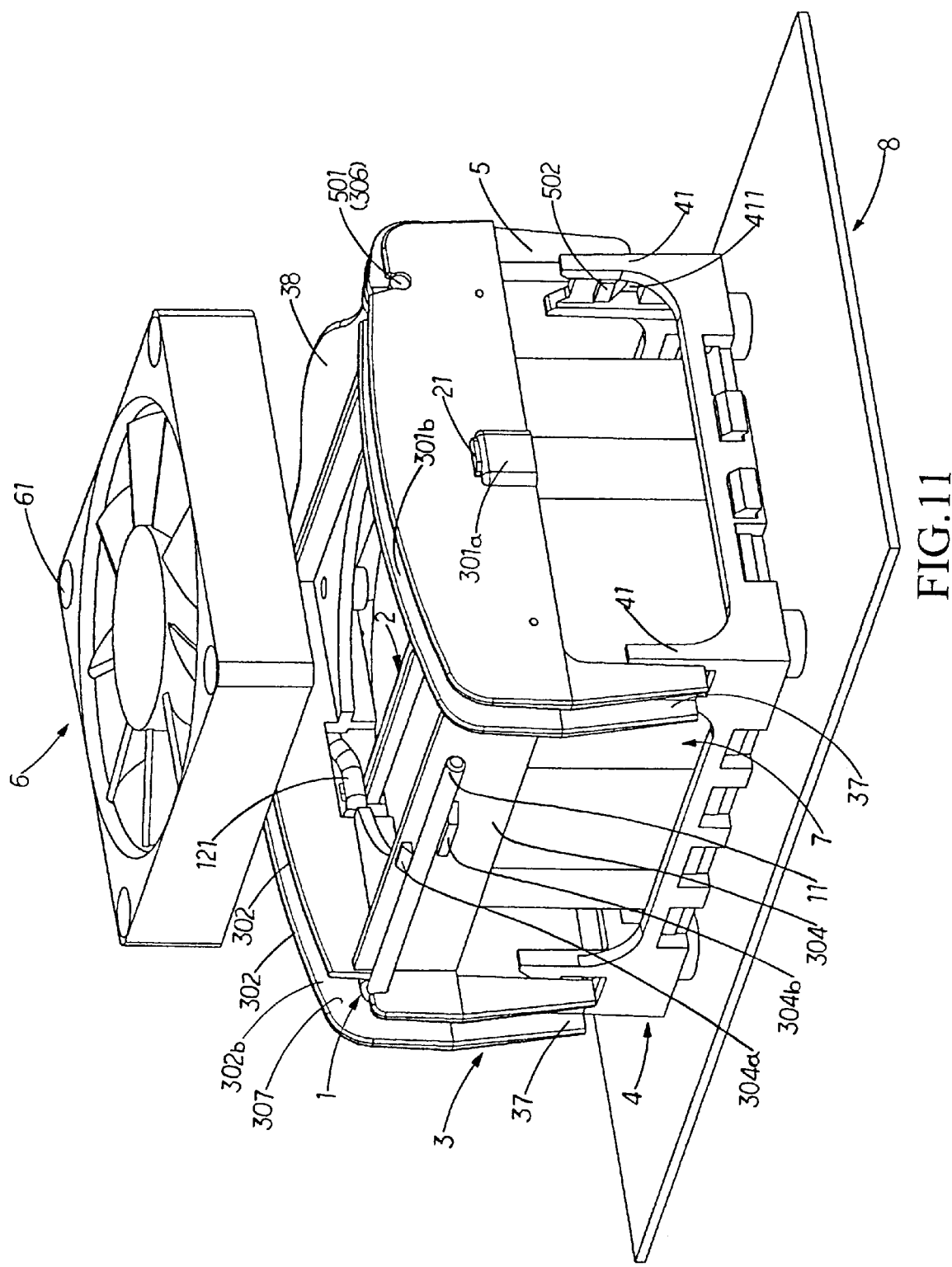
FIG. 11 is a partially assembled perspective view of FIG. 1 viewed from another side thereof.
Figure 12:
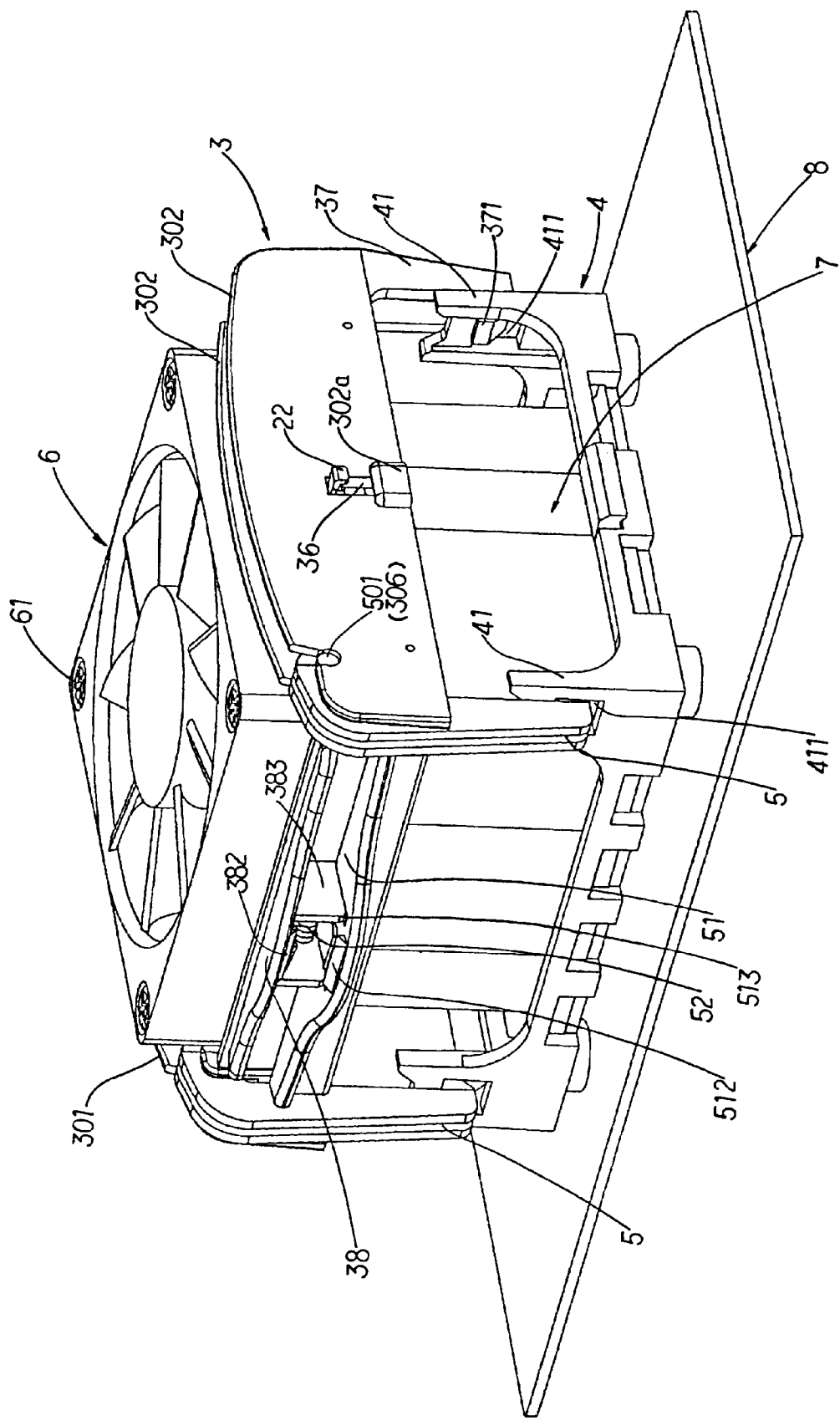
FIG. 12 is a fully assembled perspective view of FIG. 1.
Figure 13:
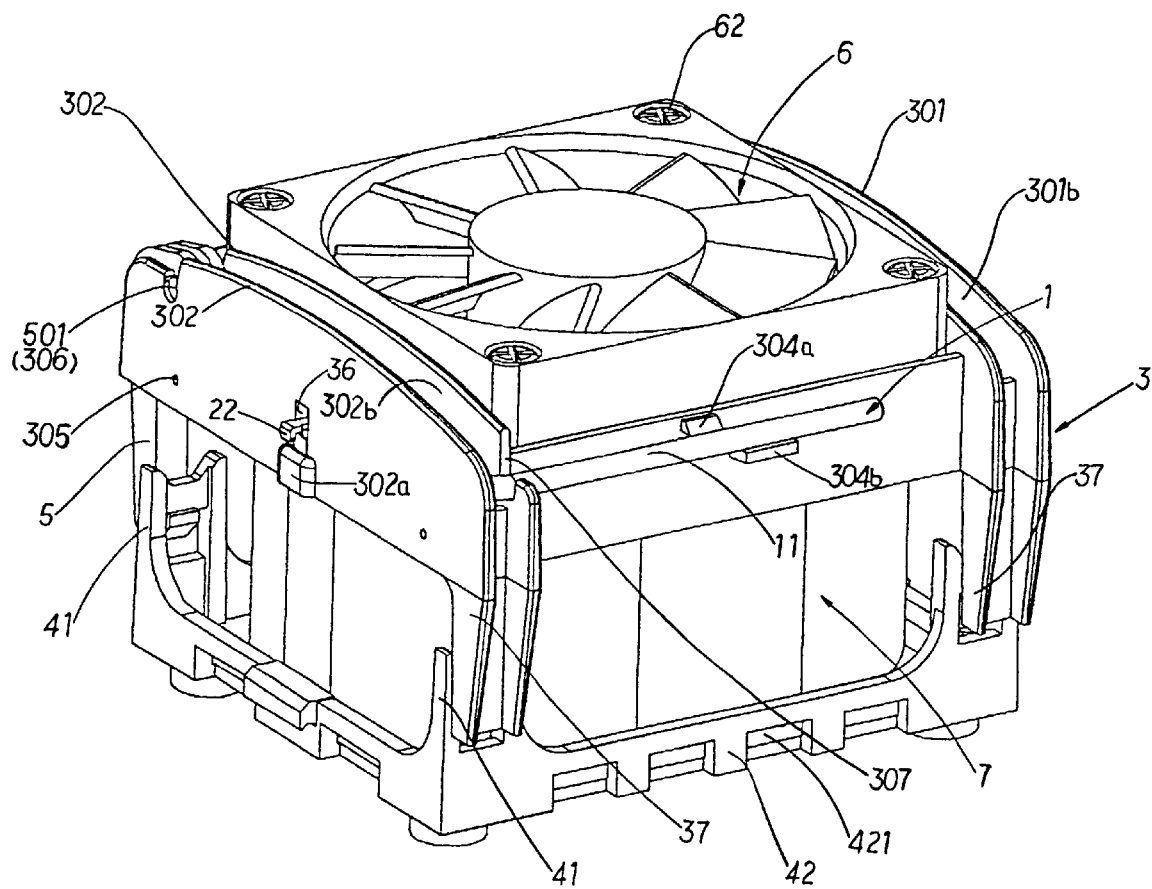
FIG. 13 is a fully assembled perspective view of FIG. 1 viewed from another side thereof.

FIGS. 11, 12 and 13 are assembled perspective views of FIG. 1 viewed from different sides of the CPU radiator assembly of the present invention. From these figures, the first major aspect of the present invention is observed. The upper frame 3 includes two opposite low wall portions 303, 304 and two opposite high wall portions 301, 302. Both the high wall portions 301 and 302 are two-layer wall portions to respectively define a passage 301b, 302b therein. The central mounting board 31 of the upper frame 3 defines a big central opening and is provided at four corners with a hole 312 each, into which the screws 62 is fastened to connect the radiator fan 6 to the upper frame 3. Please also refer to FIGS. 2, 5 and 6. Portions of the central mounting board 31 that are extended into the passages 301b, 302b of the two high wall portions 301, 302 provide two connecting surfaces 311. Please refer back to FIG. 1. The two first legs 37 are separately downward extended from two ends of the high wall portions 301, 302 that are adjacent to two ends of the low wall portion 304. The first and the second legs 37, 5 are provided at each lower end with a retaining hook 371, 502, such that the two retaining hooks 371 and the two retaining hooks 502 project inward to face one another. The high wall portions 301, 302 are provided at an upper edge of their respective ends adjacent to the low wall portion 303 with a notch 306 each.

Figure 2:
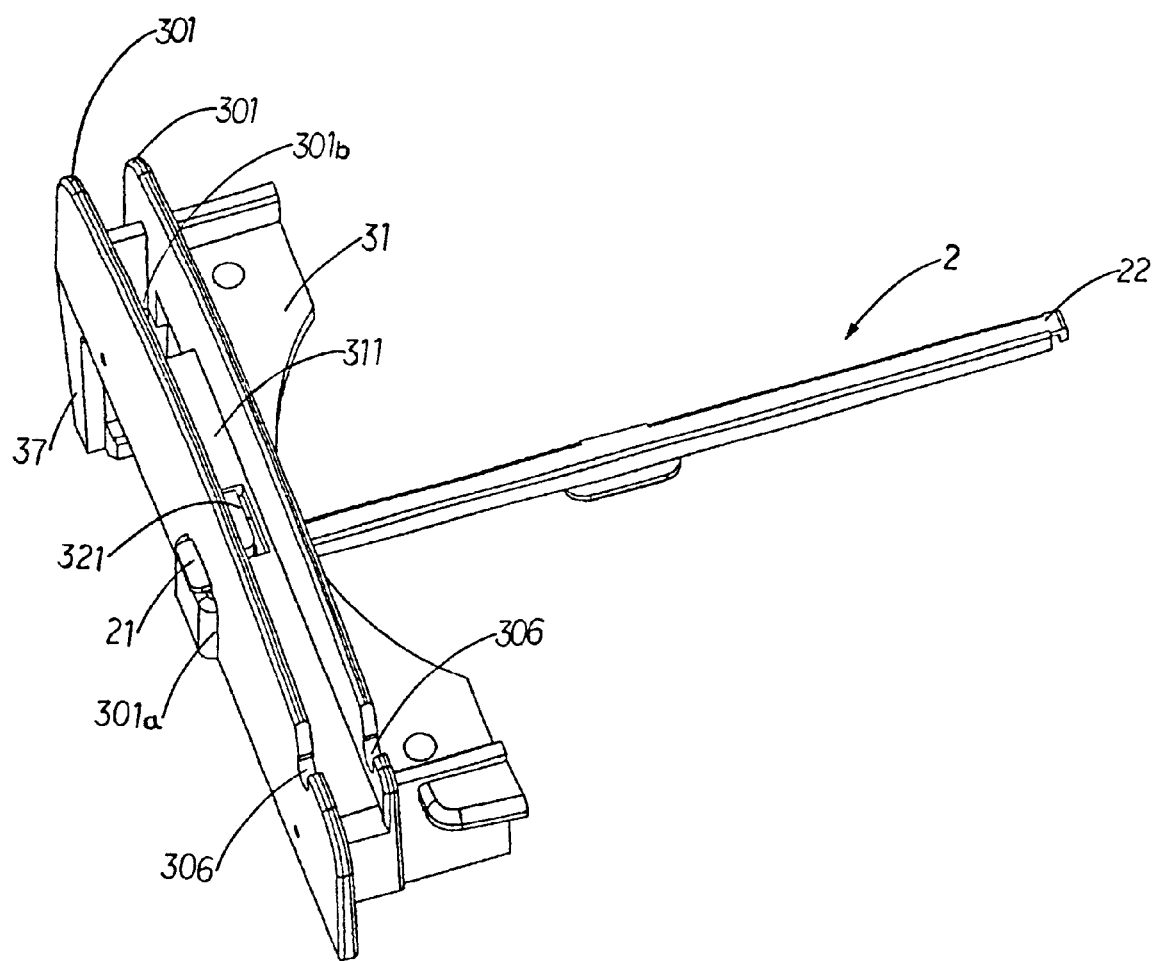
FIG. 2 is a fragmentary, sectioned top perspective view showing a left half of an upper frame included in the CPU radiator assembly of FIG. 1, wherein a pressing member is pivotally connected at a connecting end to the upper frame.
Figure 3:
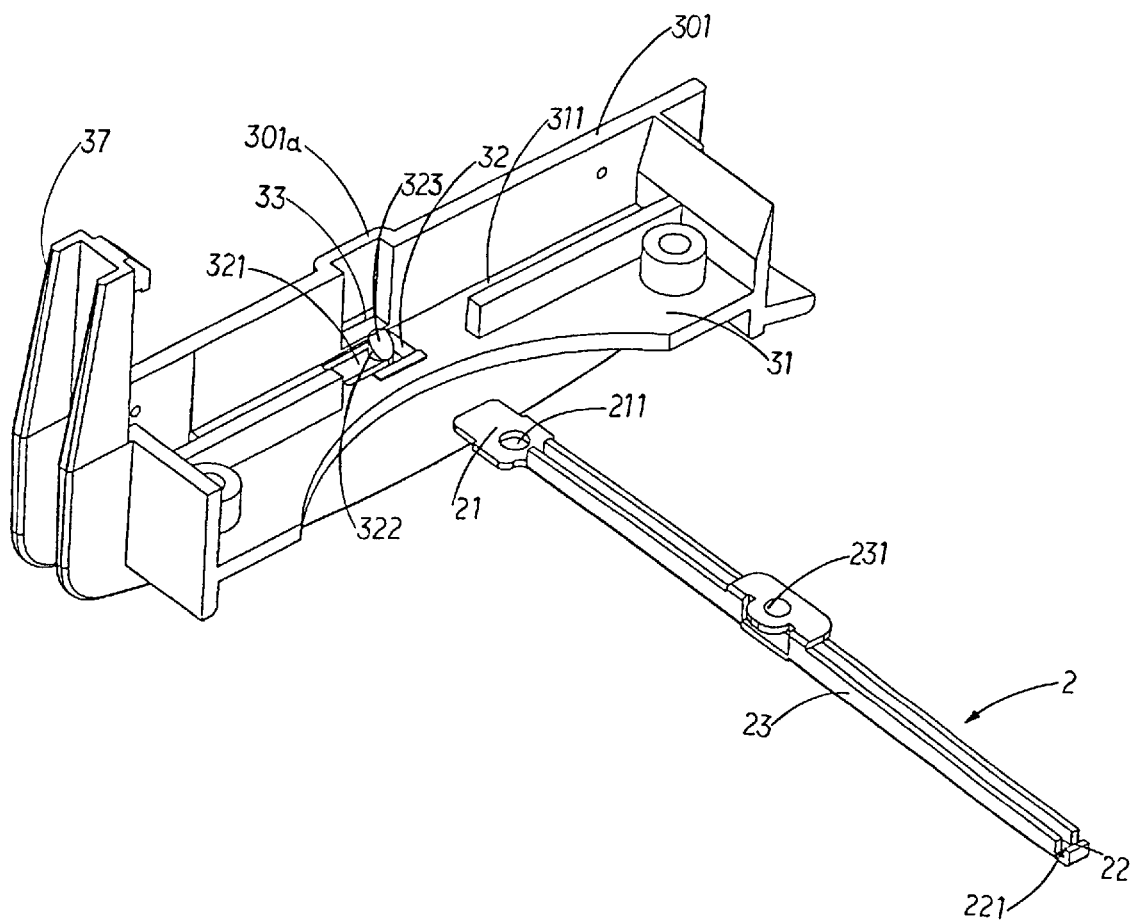
FIG. 3 is an exploded bottom perspective view of FIG. 2.
Figure 4:
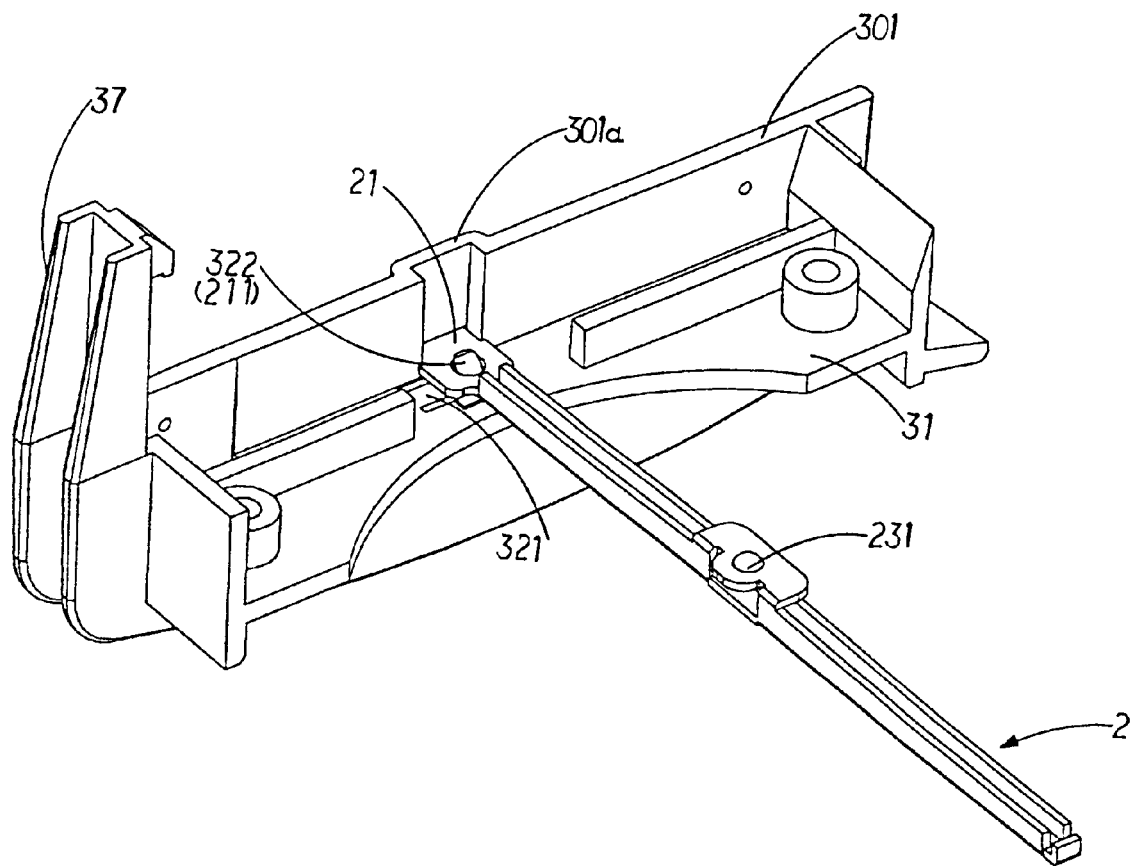
FIG. 4 is an assembled bottom perspective view of FIG. 2.

FIGS. 2, 3 and 4 show the manner in which a connecting end 21 of the pressing member 2 is connected to the upper frame 3. Please refer to these figures and FIGS. 1 and 20 at the same time. A first embodiment of the pressing member 2 includes a long beam 23 having a connecting end 21 and a free end 22. The long beam 23 is provided at a bottom center with a downward protrusion 231 that divides a bottom side of the long beam 23 into two sections. The bottom sides of these two sections separately upward incline from the protrusion 231 toward the connecting end 21 and the free end 22. As can be clearly seen from FIG. 20 that is a bottom perspective view of the pressing member 2, the long beam 23 of the pressing member 2 has a substantially n-shaped cross section. The connecting end 21 of the long beam 23 is a flat plate provided with a through hole 211, and the free end 22 of the long beam 23 is a downward bent flat plate defining an engaging slot 221 between the free end 22 and the n-shaped long beam 23. The n-shaped long beam 23 includes two opposite longitudinal wall portions 232 and a top surface integrally extended between two upper edges of the two longitudinal wall portions 232. One of the longitudinal wall portions 232 is provided near a lower middle with an extension portion 24 that is bent to extend across the bottom center of the long beam 23, such that the extension portion 24 is in a plane in parallel with the top surface of the long beam 23. The previously mentioned protrusion 231 is formed at a bottom side of the extension portion 24 and preferably has a round configuration. Bottom sides of the long beam 23 at two sides of the extension portion 24 gradually and symmetrically incline upward from the extension portion 24 toward the connecting end 21 and the free end 22.

Please refer back to FIGS. 2, 3 and 4. A portion of the high wall portion 301 of the upper frame 3 that is below the central mounting board 31 is provided at an outer side with a raised area 301a (see FIG. 2), such that an inner side of the raised area 301a correspondingly forms a recess (see FIG. 3). An insertion slot 33 is provided at an upper end of the raised area 301 for the flat connecting end 21 of the pressing member 2 to insert thereinto (see FIG. 3). The connecting surface 311 in the two-layer high wall portion 301 is provided at a position adjacent to the insertion slot 33 with an opening 32. An arm 321 integrally extends from the connecting surface 311 into the opening 32. A free end of the arm 321 is provided at a lower side with a vertical projection 322 that includes a beveled bottom surface 323. When the connecting end 21 of the pressing member 2 is inserted into the insertion slot 33, the through hole 211 engages with the projection 322 and is therefore connected to the upper frame 3 and held in place, as shown in FIG. 4. The beveled bottom surface 323 enables the connecting end 21 of the pressing member 2 to more easily pass the projection 322 and enter into the insertion slot 33. When the pressing member 2 is connected to the upper frame 3 with the flat connecting end 21 received in the insertion slot 33 and the through hole 211 engaged with the projection 322, it is located in place in the upper frame 3 in all directions.

Figure 5:
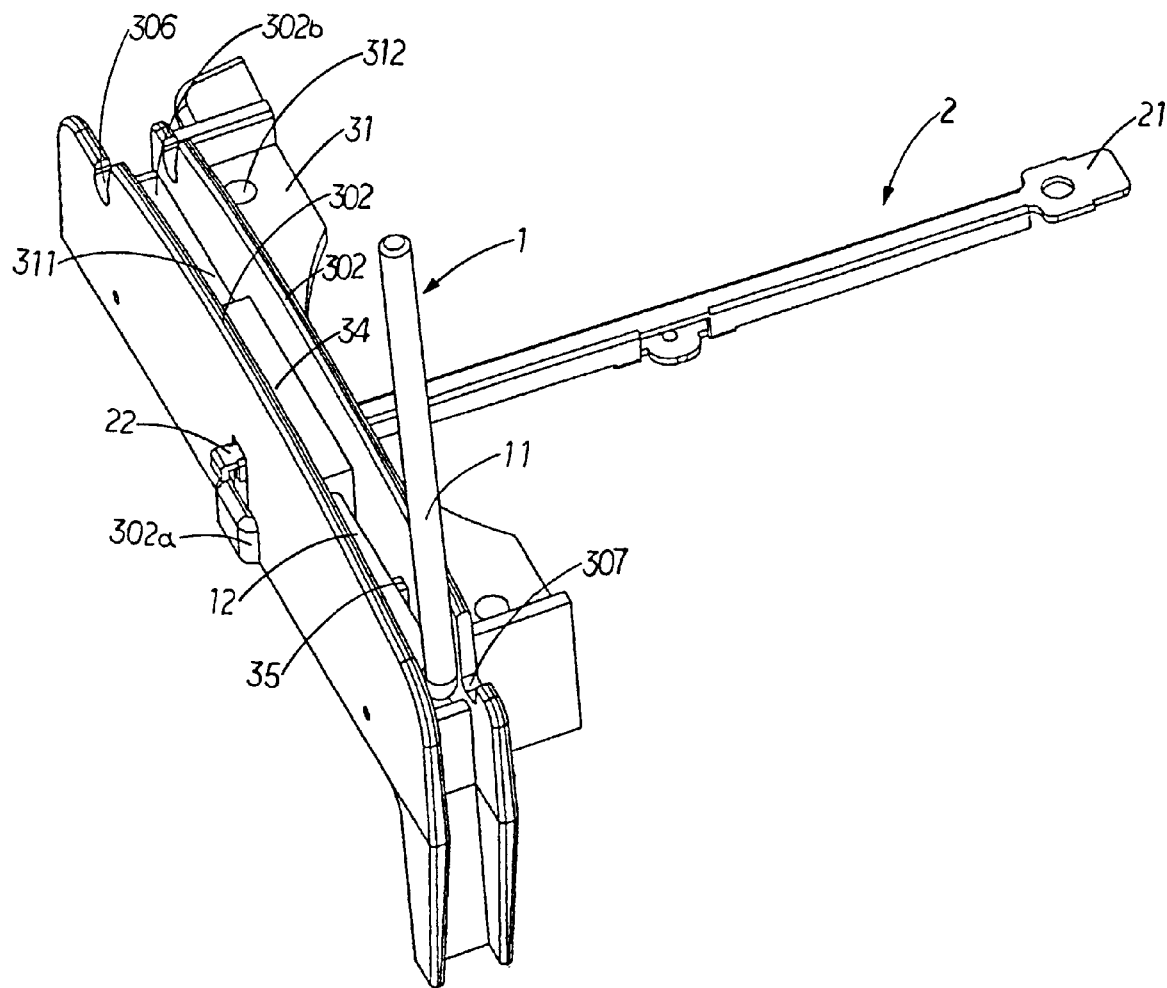
FIG. 5 is a fragmentary, sectioned top perspective view showing a right half of the upper frame of the CPU radiator assembly of FIG. 1, wherein the pressing member is movably connected at a free end to the upper frame, and a control bar is in a standby position.
Figure 6:
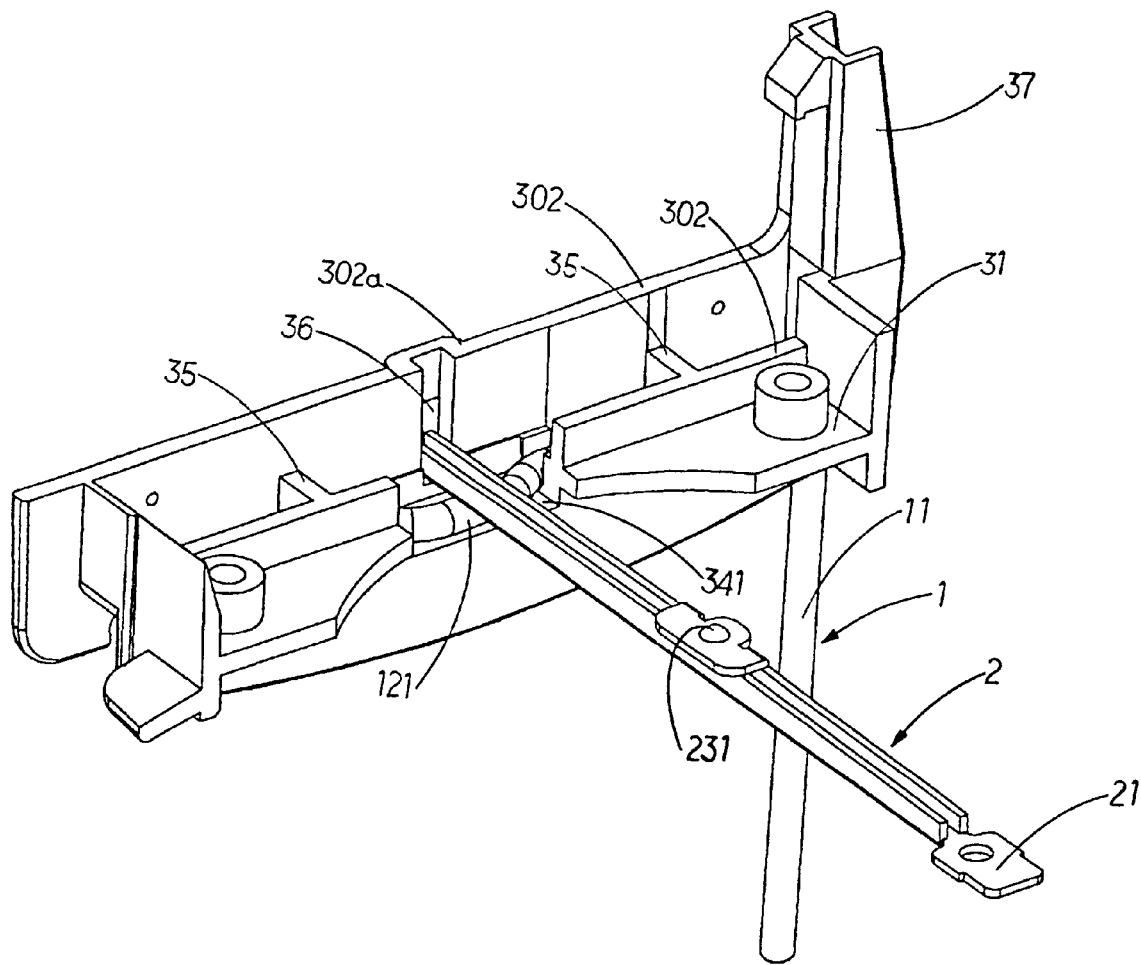
FIG. 6 is a bottom perspective view of FIG. 5.
Figure 7:
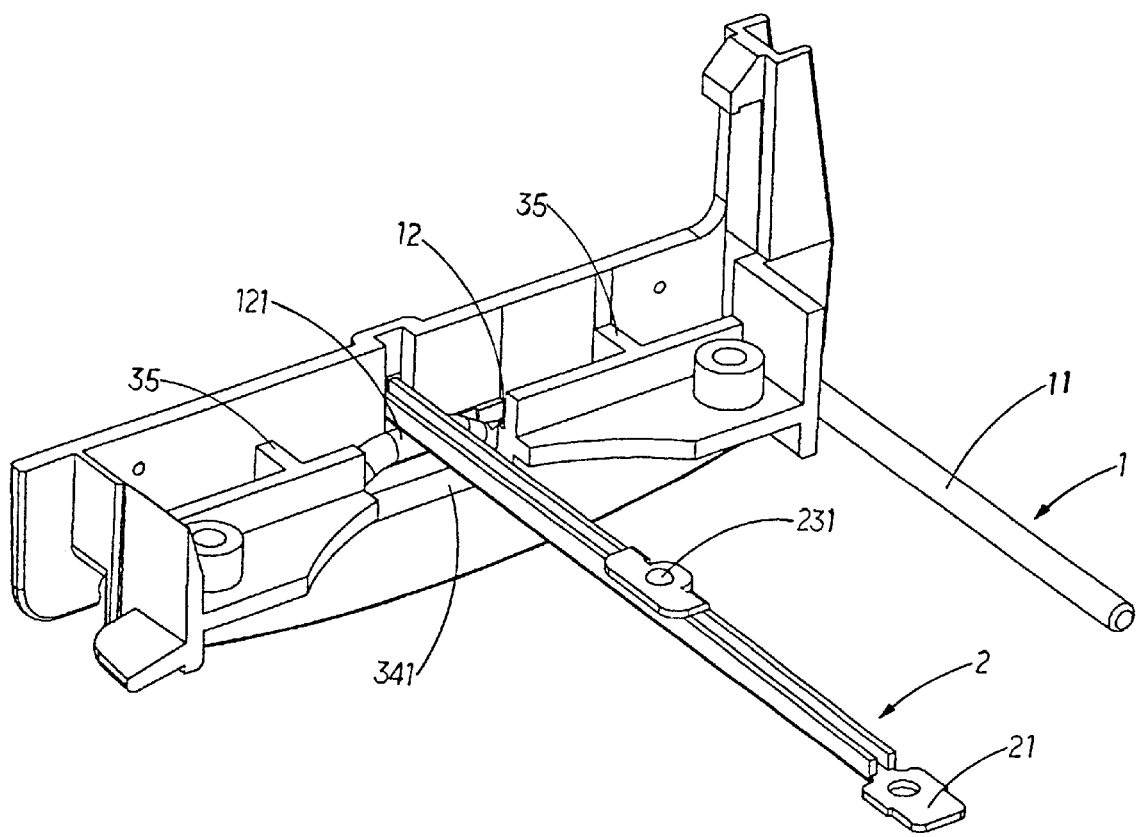
FIG. 7 is a bottom perspective view of FIG. 5 with the control bar in a working position.

Please further refer to FIGS. 5, 6 and 7 that show the manners in which the free end 22 of the pressing member 2 and the control bar are connected to the upper frame 3. The control bar 1, as shown in FIG. 1, is an L-shaped member including a grip portion 11 and a working portion 12. The working portion 12 includes a section between two ends thereof that is bent into a curved eccentric portion 121. Other parts of the working portion 12 at two sides of the eccentric portion 121 are pivotally received in the passage 302*b* in the high wall portion 302 (see FIG. 5), such that when the grip portion 11 of the control bar 1 is in a standby position to extend in a direction perpendicular to the circuit board 8, the working portion 12 of the control bar 1 is positioned in the passage 302*b* with the eccentric portion 121 flatly lying in the passage 302*b* and projected toward an inner side of the upper frame 3, as shown in FIG. 6. And, when the grip portion 11 is turned to a working position to horizontally locate adjacent to an outer side of the low wall portion 304, as shown in FIG. 11, the working portion 12 is turned in the passage 302*b* with the eccentric portion 121 moved to a downward projected position, as shown in FIG. 7.

Please refer to FIGS. 1 and 5. The high wall portion 302 of the upper frame 3 is provided at an outer side with a raised area 302*a*, such that an inner side of the raised area 302*a* correspondingly forms a recess (see FIG. 6). The raised area 302*a* is provided with a vertically extended elongated stop slot 36 that receives and limits the free end 22 of the pressing member 2 to vertically move in a range defined by the stop slot 36. A portion of the connecting surface 311 in the passage 302*b* corresponding to the working portion 12 of the control bar 1 is cut away to form an opening. And, an open-bottomed hood 34 is provided above the opening in the passage 302*b* corresponding to the stop slot 36, as shown in FIGS. 5 and 6, so that a moving space 341 is provided in the hood 34 to accommodate the eccentric portion 121 when the latter is turned upward through the grip portion 11 of the control bar 1. Supports 35 are provided in the passage 302*b* at two sides of the hood 34 to support two ends of the working portion 12 of the control bar 1 thereon, such that the eccentric portion 121 is located below the hood 34. Whereby when the grip portion 11 of the control bar 1 is turned, the working portion 12 is turned about its central axis in the passage 302*b*. When the grip portion 11 of the control bar 1 is in the above-described standby position, the eccentric portion 121 is sideward projected toward the inner side of the upper frame 3, and the free end 22 of the pressing member 2 is located at an upper end of the stop slot 36. And, when the grip portion 11 of the control bar 1 is turned to the above-described working position, as shown in FIG. 7, the eccentric portion 121 is turned to project downward and thereby urges the free end 22 of the pressing member 2 to a lower end of the stop slot 36.

Figure 14:
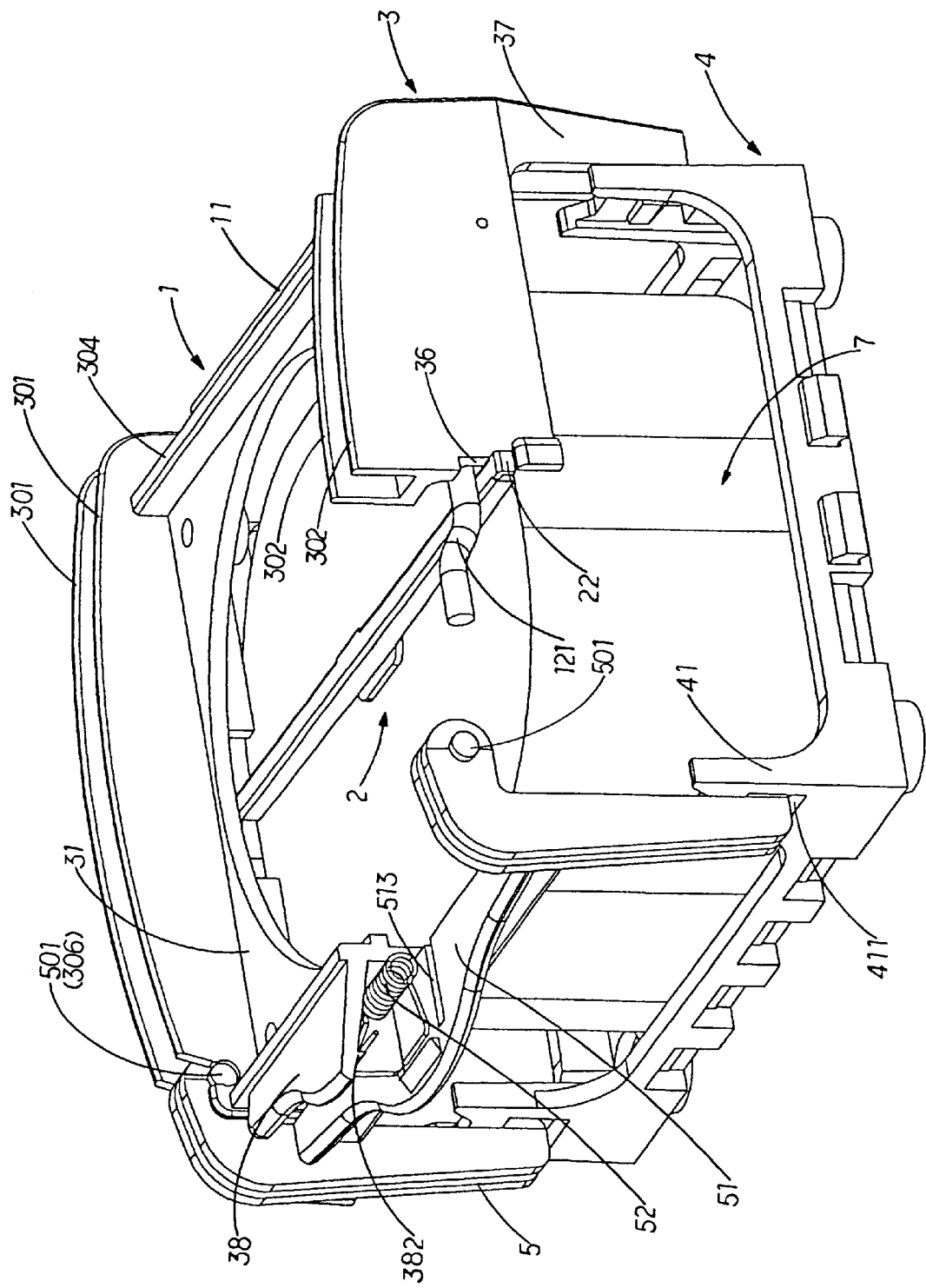
FIG. 14 is similar to FIG. 12 with a part thereof cut away and a radiator fan removed therefrom to show components of the present invention are in a tightly assembled state.
Figure 15:
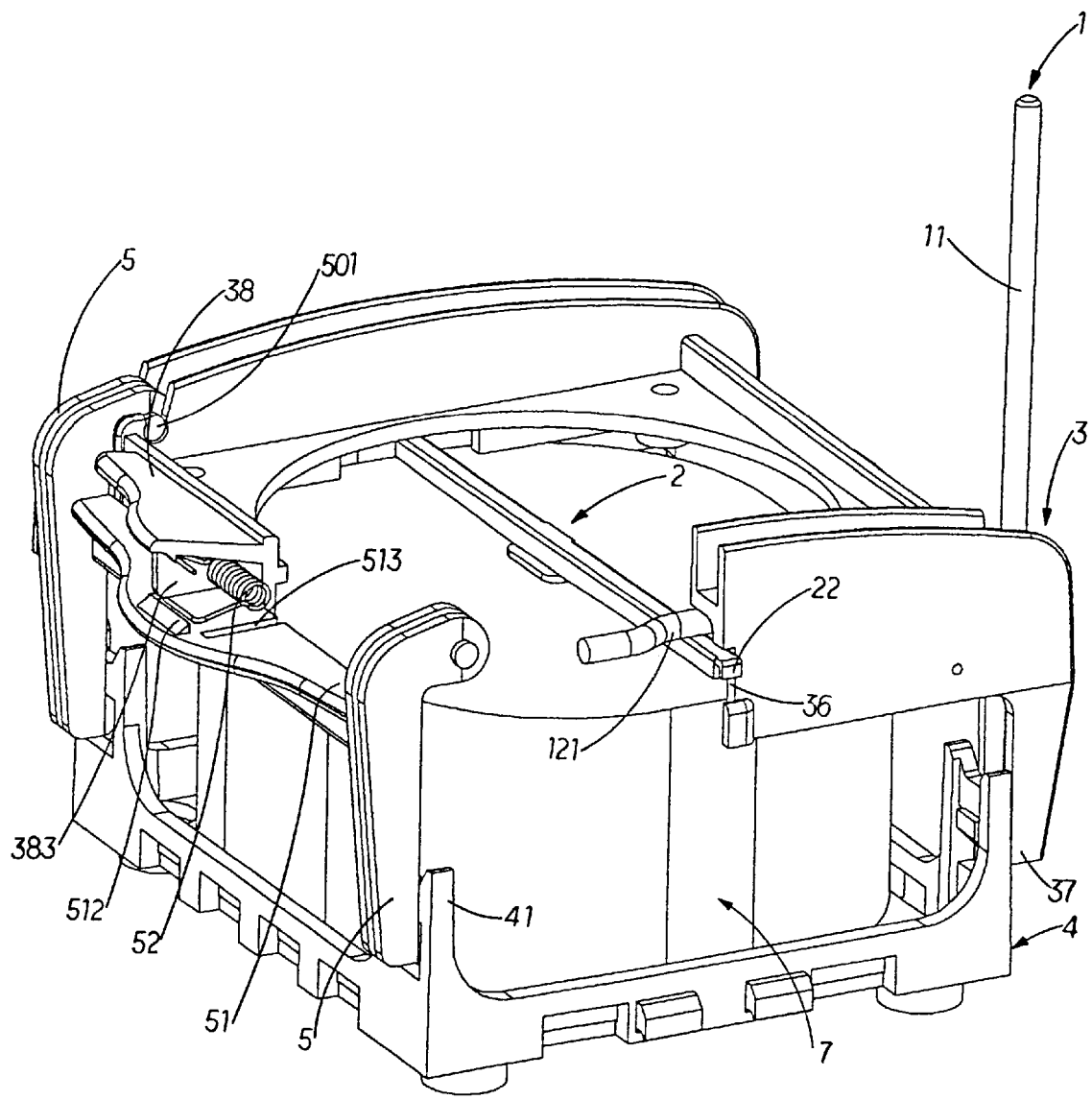
FIG. 15 is similar to FIG. 14 but with the control bar moved to the standby position.
Figure 16:
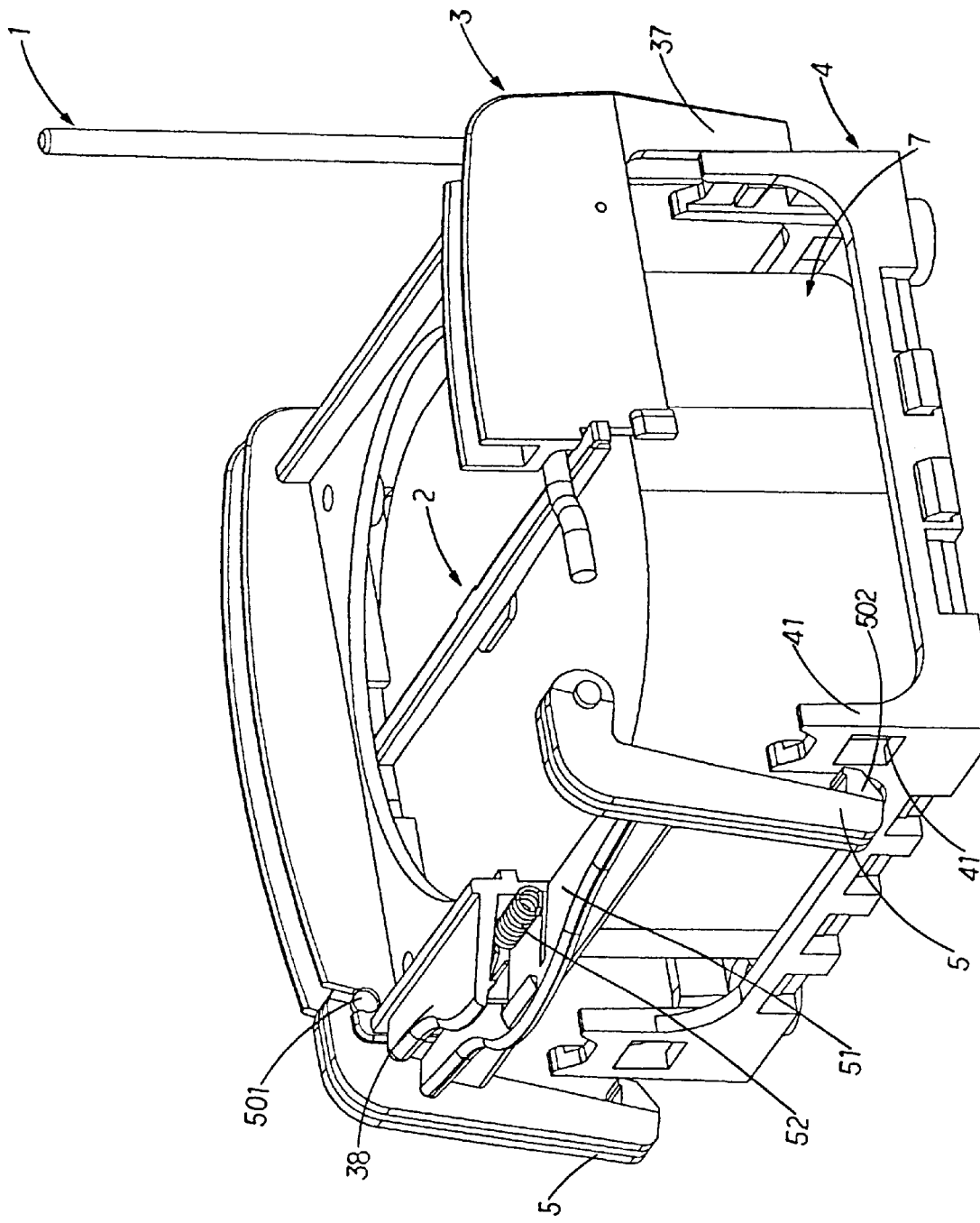
FIG. 16 is similar to FIG. 15 with the second legs disengaged from the lower frame.

Please refer to FIG. 15 that shows the upper frame 3 is connected to the lower frame 4 with the first and the second legs 37, 5 hooked onto the lower frame 4, and the control bar is in the standby position. At this point, the eccentric portion 121 is sideward and inward projected and the free end 22 of the pressing member 2 is at the upper end of the stop slot 36 to contact with the eccentric portion 121. And, FIG. 14 is similar to FIG. 15 but with the control bar 1 turned to the working position. At this point, the eccentric portion 121 is downward projected to elastically push against the free end 22 of the pressing member 2, causing the pressing member 2 to pivotally turn about the connecting end 21 and displace the free end 22 downward by a predetermined angle, bringing the free end 22 to the lower end of the stop slot 36. As can be found from the above description, when the control bar 1 is turned to the working position, the pressing member 2 is completely urged downward without producing any sideward force. The completely downward pushed pressing member 2 therefore enables the upper and the lower frames 3, 4 having the radiator block 7 interposed therebetween to firmly connect together while being subjected to two forces in opposite directions, as will described in more details hereunder, and the radiator block 7 to tightly contact the CPU 81 without any clearance left between them to obtain the maximum efficiency of thermal conduction. And, to prevent the grip portion 11 of the control bar 1 in the working position from returning to the standby position due to a counter force from the pressing member 2, an upper retaining block 304*a* having an upper bevel surface and a lower retaining block 304*b* are vertically spaced at the outer side of the low wall surface 304 corresponding to the grip portion 11 in the working position, so that the grip portion 11 in the working position is held between the upper and the lower retaining blocks 304*a*, 304*b*, as shown in FIG. 11.

Please refer to FIGS. 4, 7 and 14 at the same time. The upper frame 3 shifts upward due to the connecting end 21 of the pressing member 2 and the working portion 12 of the control bar 1 in the passage 302*b*; the radiator block 7 is urged downward under a pressure from the bottom center or the downward protrusion 231 of the pressing member 2; and the lower frame 4 bears a downward force from the lowered radiator block 7. That is, the upper and the lower frames 3, 4 are connected together by the first and the second legs 37, 5 while they are subjected to two forces in opposite directions. The bottom central protrusion 231 of the pressing member 2 is pressed against a top of the radiator block 7 and serves as a fulcrum on the pressing member 2. When the free end 22 of the pressing member 2 is forced downward by the eccentric portion 121 with the downward protrusion 231 pressing against the top of the radiator block 7, the connecting end 21 of the pressing member 2 moves upward as a result of leverage to bring one side of the upper frame 3 adjacent to the connecting end 21 to shift upward. The upward shifting of the upper frame 3 at one side would naturally cause an opposite side thereof, that is, the side with the control bar 1 mounted thereto, to shift upward at the same time.

To enable smooth turning of the grip portion 11 of the control bar 1 from the vertical standby position into the horizontal working position, a notch 307 is provided on an inner layer of the high wall portion 302 of the upper frame 3 to accommodate the grip portion 11 in the horizontal position, as shown in FIG. 5.

Figure 9:
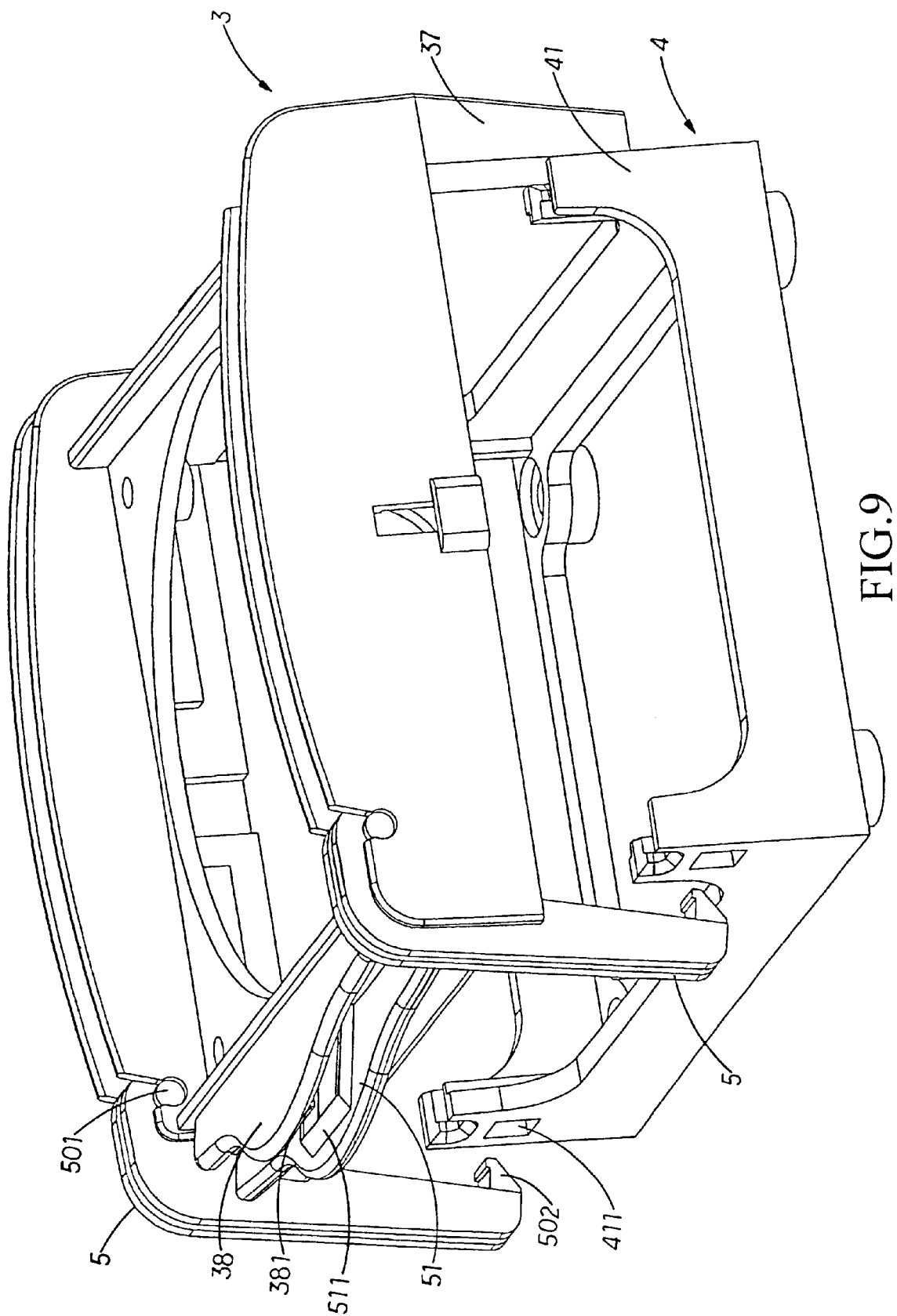
FIG. 9 shows the upper frame of FIG. 8c and a lower frame of the radiator assembly of the present invention before being connected to each other, wherein two locating frames are provided to hold the elastic element for controlling the second legs.
Figure 10:
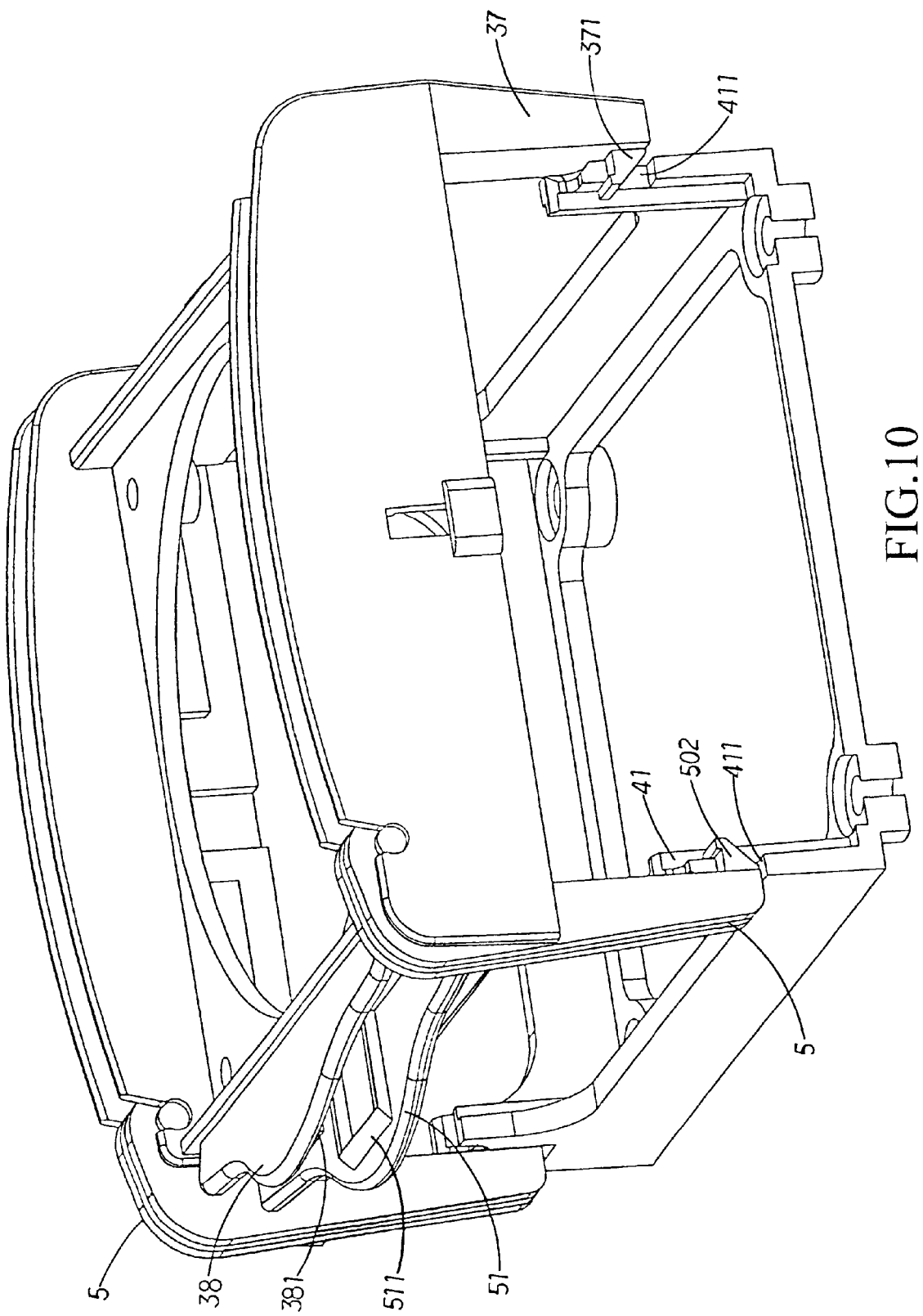
FIG. 10 is an assembled perspective view of FIG. 9.

Please refer back to FIG. 1. The two movable second legs 5 are symmetrically formed and in the shape of an inverted letter L having a horizontal and a vertical section. An outer end of the horizontal section of each second leg 5 is provided with pivotal shafts 501 for engaging with the notches 306 provided on the high wall portions 301, 302 of the upper frame 3. The movable lip member 51 is transversely extended between the two vertical sections of the second legs 5 at a predetermined position. The fixed lip member 38 is fixedly provided on the upper frame 3 on the low wall portion 303 to locate above the movable lip member 51. An elastic supporting member is fixed between the fixed and the movable lip members 38, 51, so that the movable lip members 51 being manually pushed toward the fixed lip member 38 could be elastically pushed away from the fixed lip member 38 due to a spring force provided by the elastic supporting member. When the movable lip member 51 is pushed toward the fixed lip member 38, the second legs 5 are caused to pivotally turn about the pivotal shafts 501, so that the two vertical sections of the second legs 5 are shifted outward relative to the upper frame 3, as shown in FIG. 10. And, when the movable lip member 51 is released, the spring force of the elastic supporting member automatically pushes and rotates the second legs 5 about the pivotal shafts 501, so that the vertical sections of the second legs 5 shift inward to hook onto the lower frame 4, as shown in FIG. 9.

Figure 8:
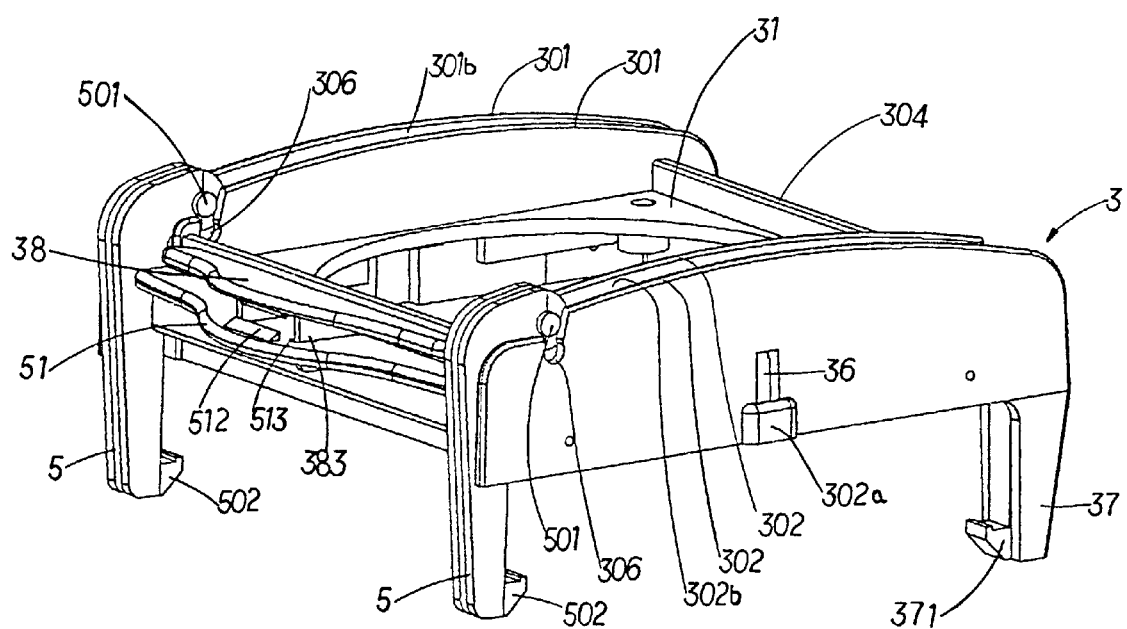
FIG. 8 is a perspective view of the upper frame before a pair of second legs is pivotally connected thereto.
Figure 8A:
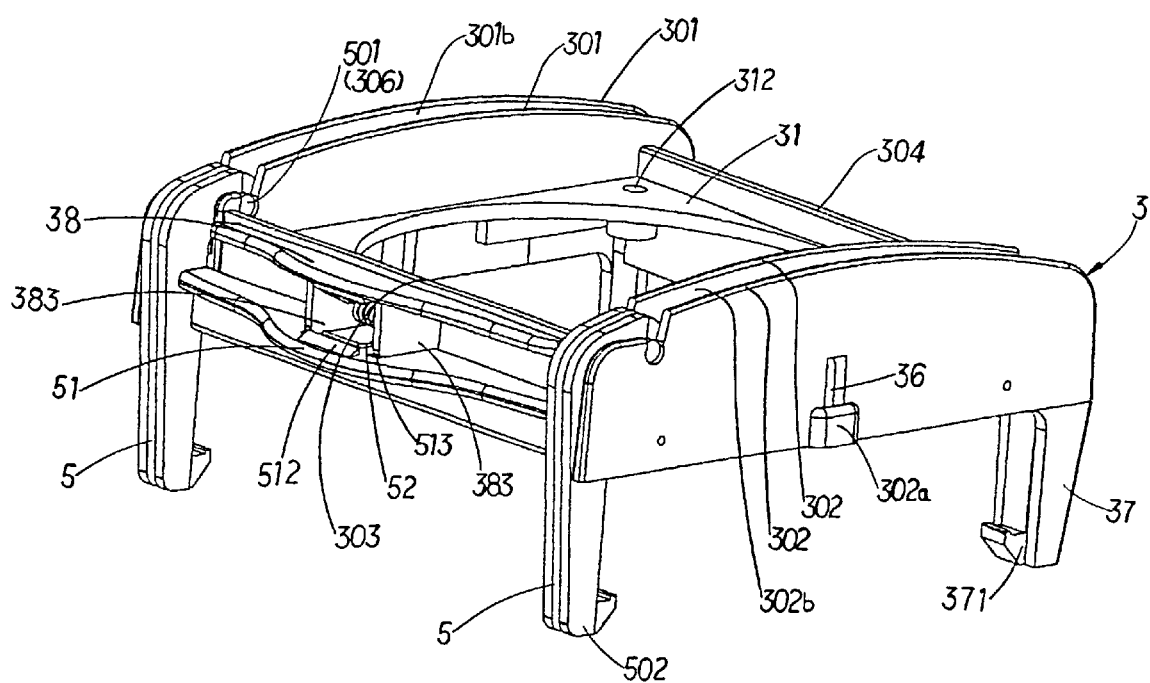
FIG. 8a is a perspective view of the upper frame after the pair of second legs has been pivotally connected thereto.

The second legs 5 have an overall thickness slightly smaller than a width of the passages 301b, 302b. Each of the second legs 5 has two pivotal shafts 501 symmetrically projected from two sides of the horizontal section of the second leg 5, and each of the pivotal shafts 501 is configured corresponding to the notches 306. By disposing the pivotal shafts 501 into the notches 306 via expanded upper openings of the notches 306, as shown in FIGS. 8 and 8a, the second legs 5 are pivotally connected to the upper frame 3. FIGS. 9 and 10 show the connection of the upper frame 3 to the lower frame 4. To do this, first engage the first legs 37 with the lower frame 4 at predetermined positions, and then push the movable lip member 51 toward the fixed lip member 38 to pivotally turn the second legs 5 outward (see FIG. 9). Thereafter, release the movable lip member 51 and allow the elastic supporting member between the two lip members 38, 51 to elastically push the movable lip member 51 away from the fixed lip member 38, causing the second legs 5 to shift inward and engage the retaining hooks 502 at inner lower ends of the second legs 5 into hook holes 411 correspondingly provided on the lower frame 4 (see FIG. 10). As can be seen from FIG. 1, the lower frame 4 is a hollow member having a surrounding wall portion 42. Four corners of the wall portion 42 extend upward to form columns 41, on which the hook holes 411 in the form of recesses or through holes are provided corresponding to the retaining hooks 371, 502 of the first and the second legs 37, 5.

Figure 8B:
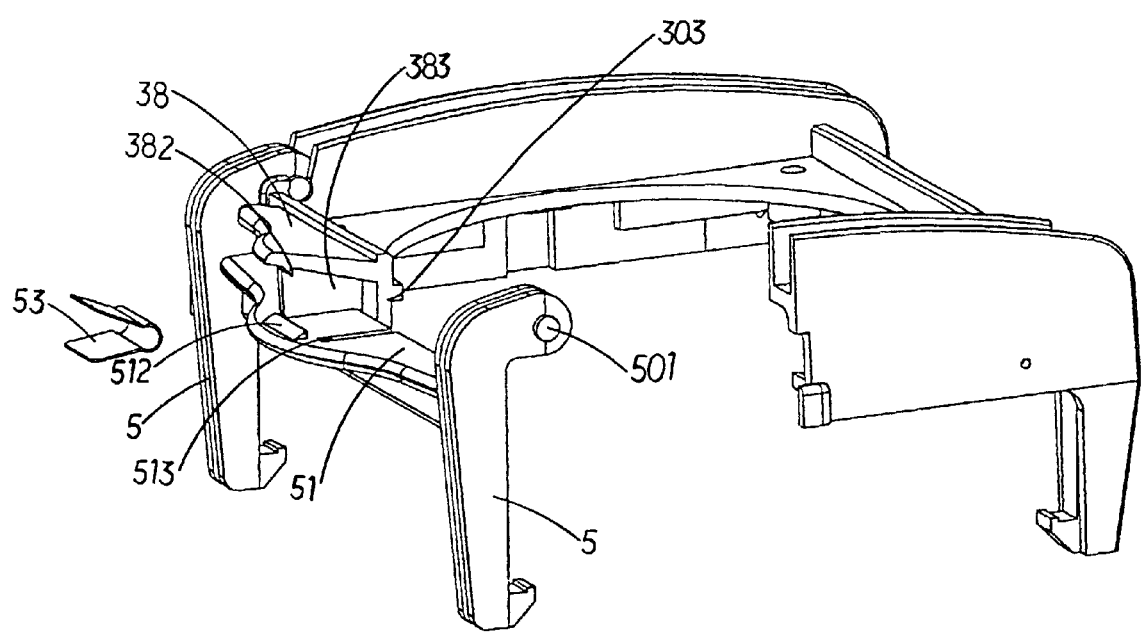
FIG. 8b is an exploded perspective view showing the pair of second legs is controlled through an elastic element in the form of a torsion leaf spring to locate at a hooking or a releasing position.
Figure 8C:
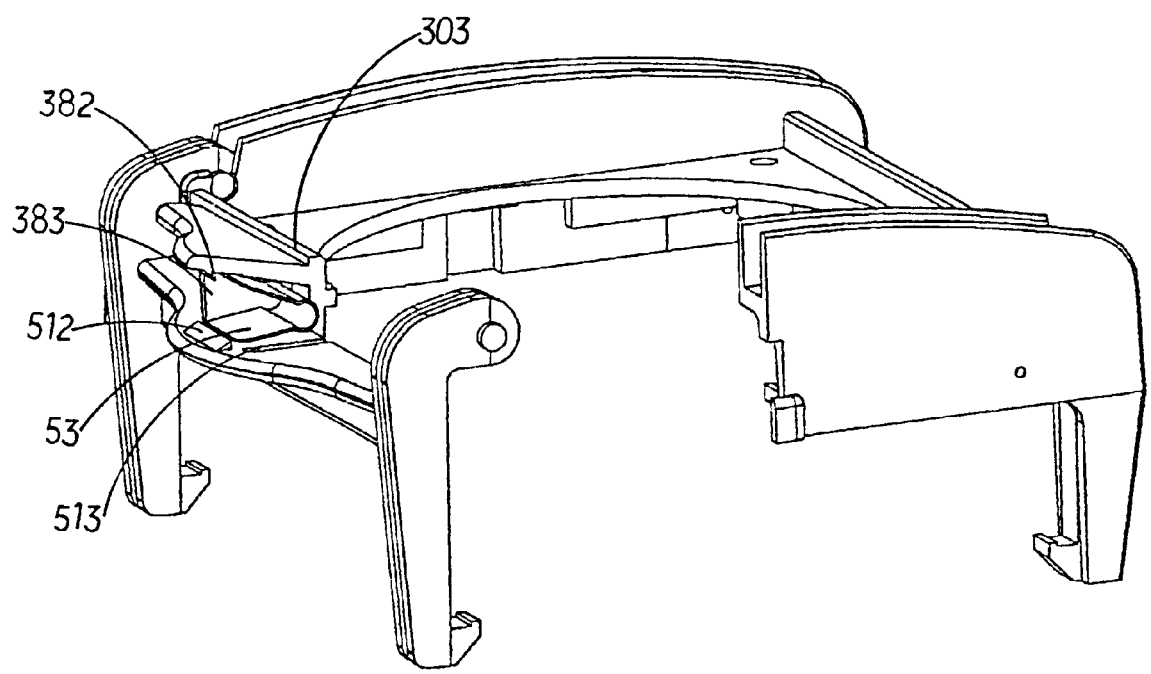
FIG. 8c is an assembled perspective view of FIG. 8b.

The fixed and the movable lip members 38, 51 are provided at surfaces facing each other with means to locate the elastic supporting member in place. The elastic supporting member may be a torsion spring 52, as shown in FIG. 1, or a torsion leaf spring 53, as shown in FIG. 8b. And, the locating means may be an upper front rib 382 and two symmetrical partitions 383 downward projected from a lower surface of the fixed lip member 38, and a lower front rib 512 and two symmetrical slots 513 provided on an upper surface of the movable lip member 51, as shown in FIGS. 1, 8, 8a, 8b, 8c, 12, and 14 to 19, such that the partitions 383 are engaged with the slots 513 to confine the elastic supporting member when the two lip members 38, 51 are pushed toward each other. Or, the locating means may be raised U-shaped frames 381, 511 provided at lower and upper surfaces of the fixed and the movable lip members 38, 51, respectively, as shown in FIGS. 9 and 10. Or, the locating means may be recesses (not shown) correspondingly provided on the fixed and the movable lip members 38, 51 for receiving and locating the elastic supporting member 52 or 53.

Please refer to FIGS. 11 to 13. Since the pressing member 2 is provided at the bottom center with the protrusion 231 to correspond to the CPU 81, a downward pushing force applied by the pressing member 2 is immediately directed to the CPU 81 and the force for securing the radiator block 7 to the CPU 81 is concentrated at the downward protrusion 231, making the radiator block 7 to absolutely press its bottom side to a top of the CPU 81 and therefore enable faster transfer of heat from the CPU 81 to the radiator block 7 and accordingly faster cooling of the CPU 81.

Please refer to FIGS. 1 and 11. The radiator block 7 is interposed between the upper and the lower frames 3, 4, and the pressing member 2 is located above and extended across the radiator block 7 with the connecting end 21 connected to one side of the upper frame 3 and the free end 22 movably located at another side opposite to the connecting end 21. With this arrangement, even the control bar 1 is in the standby position, the pressing member 2 alone could effectively apply a downward pressure on the radiator block 7 and accordingly the lower frame 4 to enable tight connection of the upper frame 3 to the lower frame 4 through the first and the second legs 37, 5 hooked onto the hook holes 411, and firm contact of the radiator block 7 with the CPU 81. So long as the upper frame 3 is connected to the lower frame 4 by means of the downward extended legs 37, 5 having retaining hooks 371, 502 provided at lower ends thereof, the pressing member 2 alone would-be sufficient to ensure tight connection of the upper frame 3 to the lower frame 4 and firm contact of the radiator block 7 with the CPU 81.

In FIGS. 1 through 17, the radiator fan 6 is assembled to the upper frame 3 by means of screws 62. However, the radiator fan 6 could also be attached to the upper frame 3 in an easier manner without using the screws 62. Please refer to FIGS. 18 and 19. The two high wall portions 301, 302 of the upper frame 3 are respectively provided near two outer ends with two insertion holes 305. The two elastic retainers 9 forming the secondary aspect of the present invention as previously mentioned are separately connected to the upper frame 3 by engaging two ends of each elastic retainer 9 into two insertion holes 305 separately located at the high wall portions 301 and 302, such that the elastic retainers 9 are pivotally turnable about the insertion holes 305. Each elastic retainer 9 is provided with two inward bends 91 corresponding to screw holes 61 provided on the radiator fan 6. When the elastic retainers 9 are pivotally turned to locate above the radiator fan 6, the inward bends 91 would engage with the screw holes 61 and thereby bind the radiator fan 6 to the upper frame 3. Each elastic retainer 9 may be a U-shaped elastic bar with two inward bent free ends for inserting into the insertion holes 305 to hold the elastic retainer 9 to the upper frame 3. The inward bends 91 are provided on a middle transverse section of the U-shaped elastic retainer 9 for engaging with the screw holes 61 to easily assemble the radiator fan 6 to the upper frame 3.

FIG. 13 shows the lower frame 4 is provided on the wall portion 42 with a plurality of vents 421, so that hot air surrounding the radiator block 7 could be effectively discharged via the vents 421 to enhance heat radiation effect of the present invention.

Figure 20:
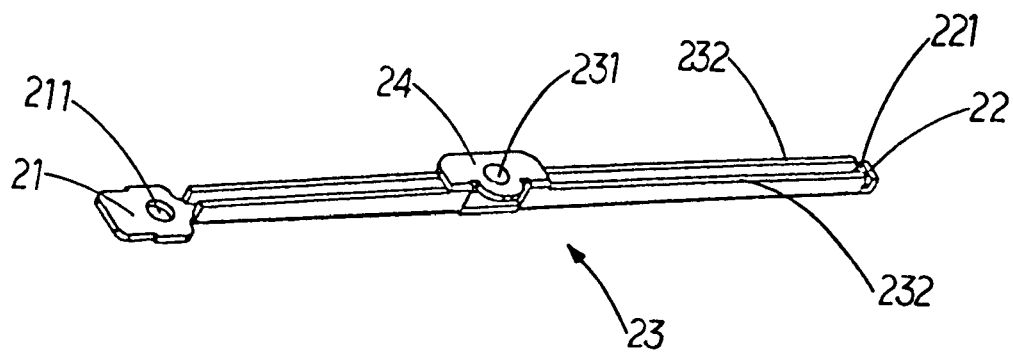
FIG. 20 is a bottom perspective view of a first embodiment of the pressing member included in the CPU radiator assembly of the present invention.

The pressing member 2 illustrated in FIGS. 1 through 19 is configured according to a first embodiment thereof shown in FIG. 20. There are still other embodiments of the pressing member 2 available for use. FIGS. 21 to 24 illustrate a second, a third, a fourth and a fifth embodiment of the pressing member 2.

Figure 21:
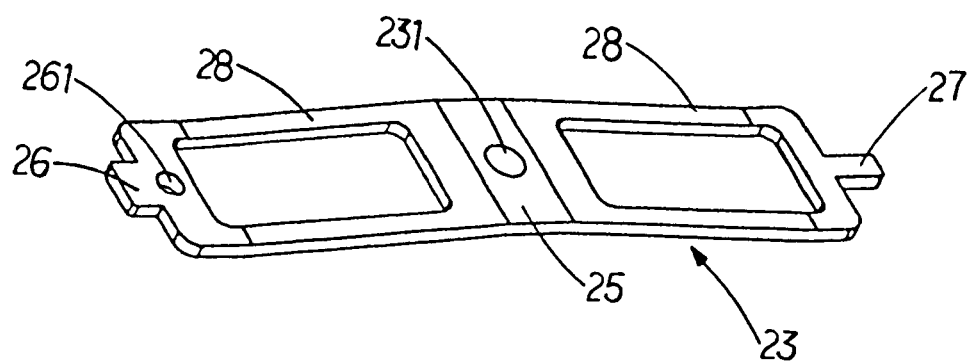
FIG. 21 is a bottom perspective view of a second embodiment of the pressing member.

Please refer to FIG. 21. The second embodiment of the pressing member 2 includes a long beam 23 formed from two symmetrical frames 28 connected through an intermediate plate 25. The intermediate plate 25 is provided at a bottom with a downward protrusion 231. The two frames 28 gradually incline upward from two ends of the intermediate plate 25 to provide a connecting end 26 and a free end 27, both of which are in the form of an axially projected plate.

Figure 22:
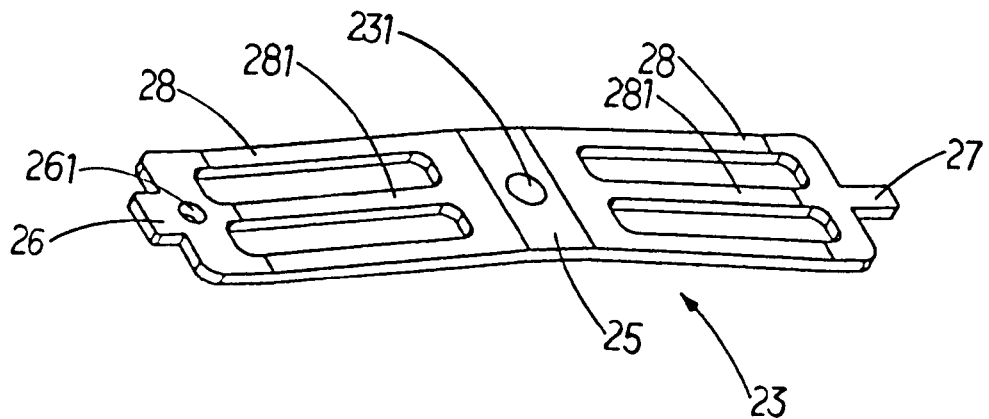
FIG. 22 is a bottom perspective view of a third embodiment of the pressing member.

The third embodiment of the pressing member 2 shown in FIG. 22 is similar to the second embodiment, except that each frame 28 has an axially extended connecting rib 281 provided therein.

Figure 23:
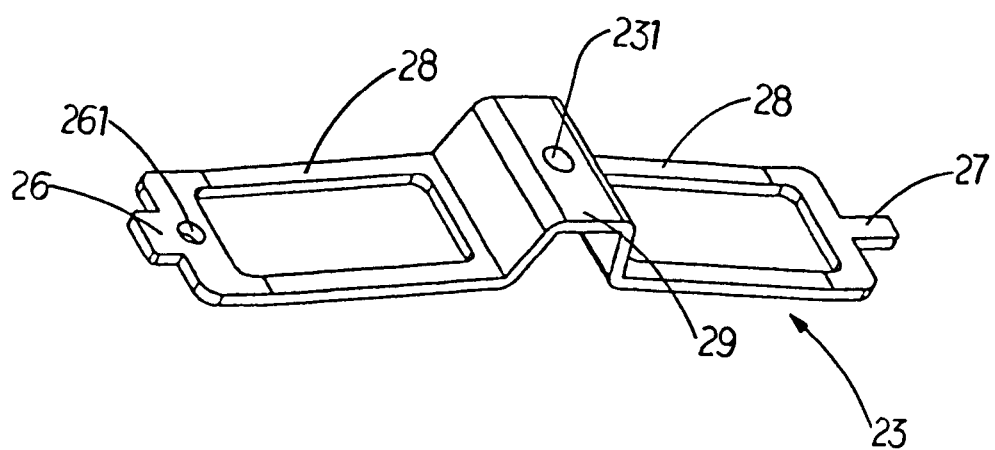
FIG. 23 is a bottom perspective view of a fourth embodiment of the pressing member.

The fourth embodiment of the pressing member 2 shown in FIG. 23 includes a long beam 23 formed from two symmetrical frames 28 connected through an integrally downward bent intermediate plate 29. The downward bent intermediate plate 29 is provided at a bottom surface with a downward protrusion 231. The two frames 28 gradually incline upward from two ends of the intermediate plate 29 to provide a connecting end 26 and a free end 27, both of which are in the form of an axially projected plate.

Figure 24:
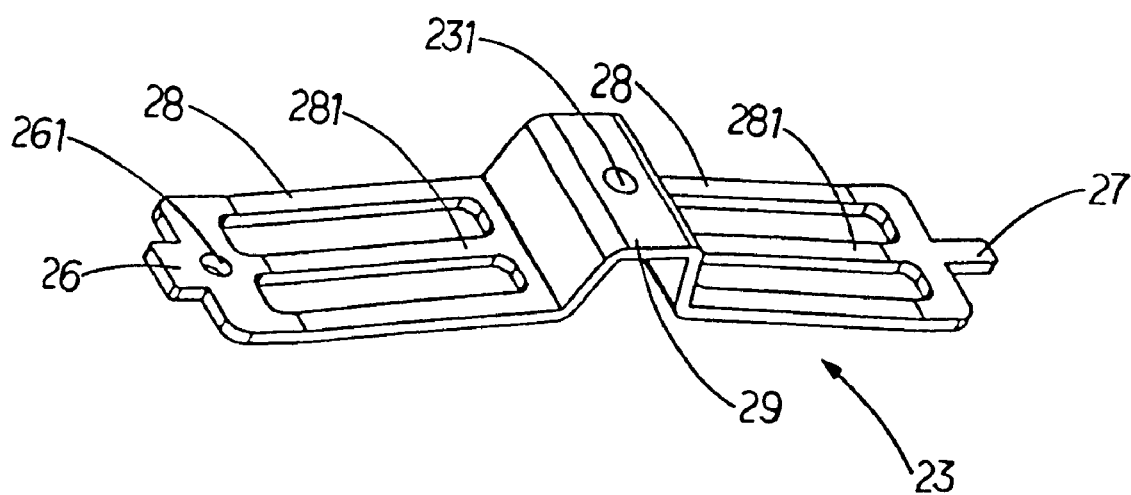
FIG. 24 is a bottom perspective view of a fifth embodiment of the pressing member.

The fifth embodiment of the pressing member 2 shown in FIG. 24 is similar to the fourth embodiment, except that each frame 28 has an axially extended connecting rib 281 provided therein.

In the above-described second, third, fourth and fifth embodiments of the pressing member 2, the connecting end 26 is provided with a through hole 261 for engaging with the projection 322.

In all the five embodiments of the pressing member 2 illustrated in FIGS. 20 to 24, the downward protrusion 231 is preferably a round protrusion, so that it is always in contact with a top center of the radiator block 7 without separating therefrom even the pressing member 2 is changed or biased in its position.

Figure 17:
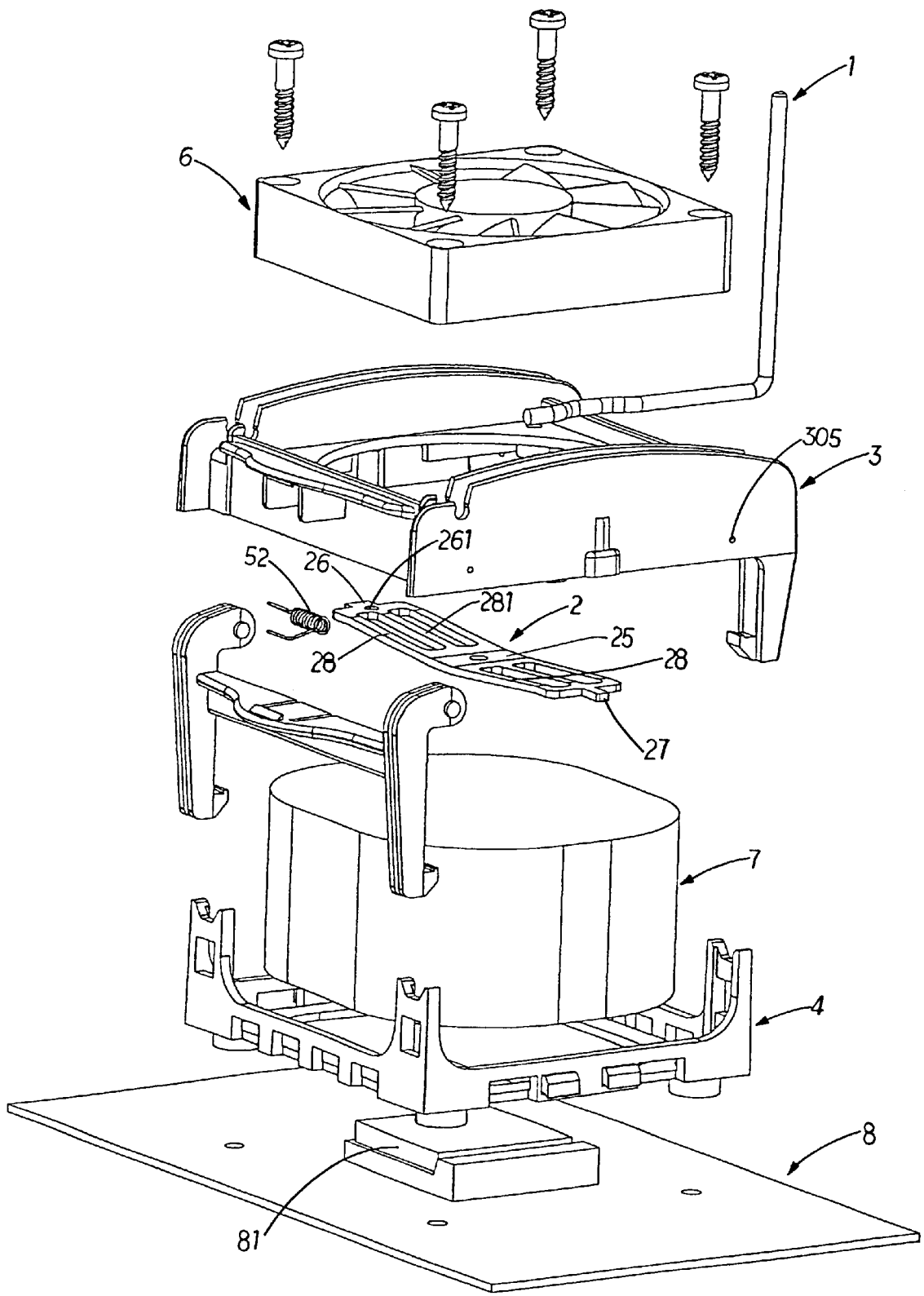
FIG. 17 is an exploded perspective view of the CPU radiator assembly of the present invention using a pressing member according to another embodiment thereof.
Figure 18:
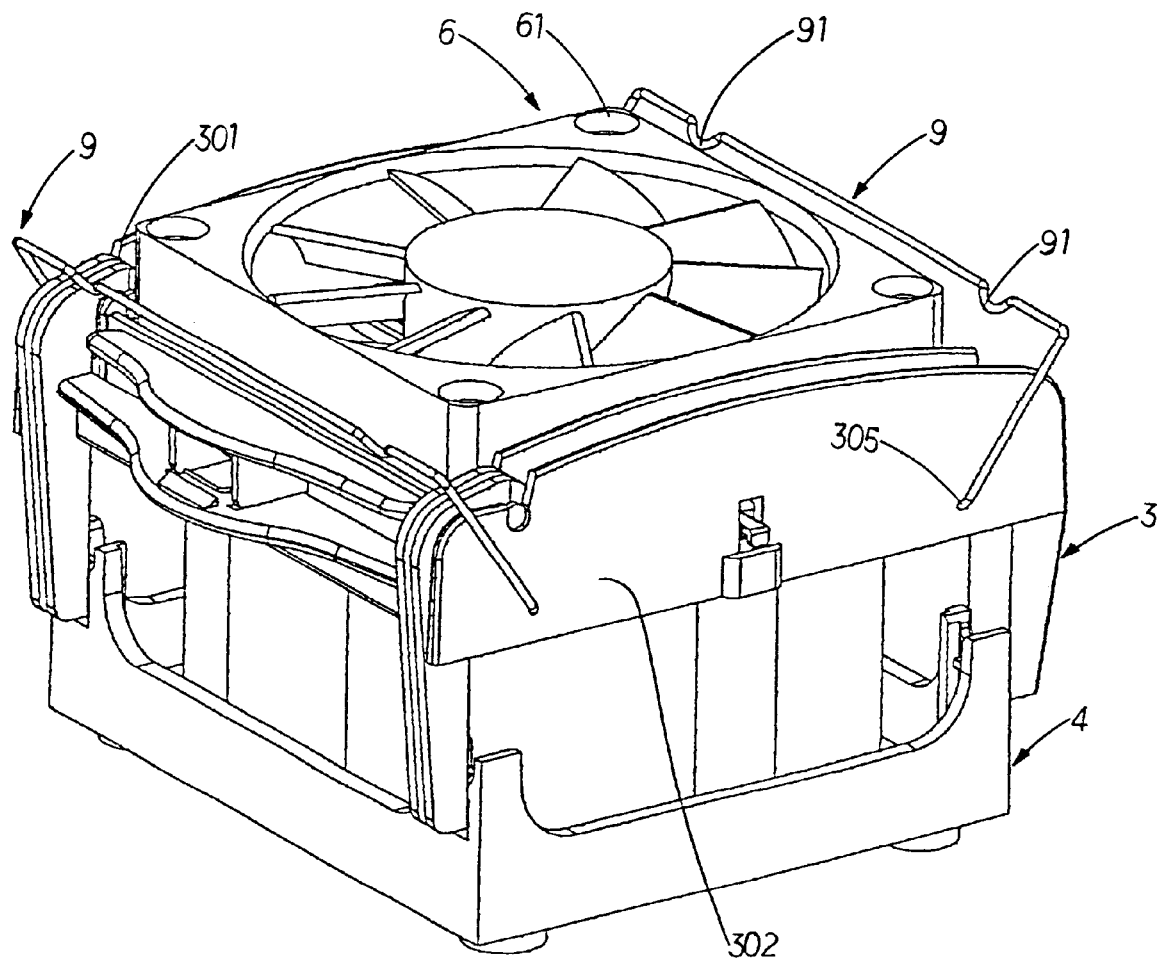
FIG. 18 is an assembled perspective view of the CPU radiator assembly of the present invention using a pair of elastic retainers to hold the radiator fan in place, wherein the elastic retainers are in a releasing position.
Figure 19:
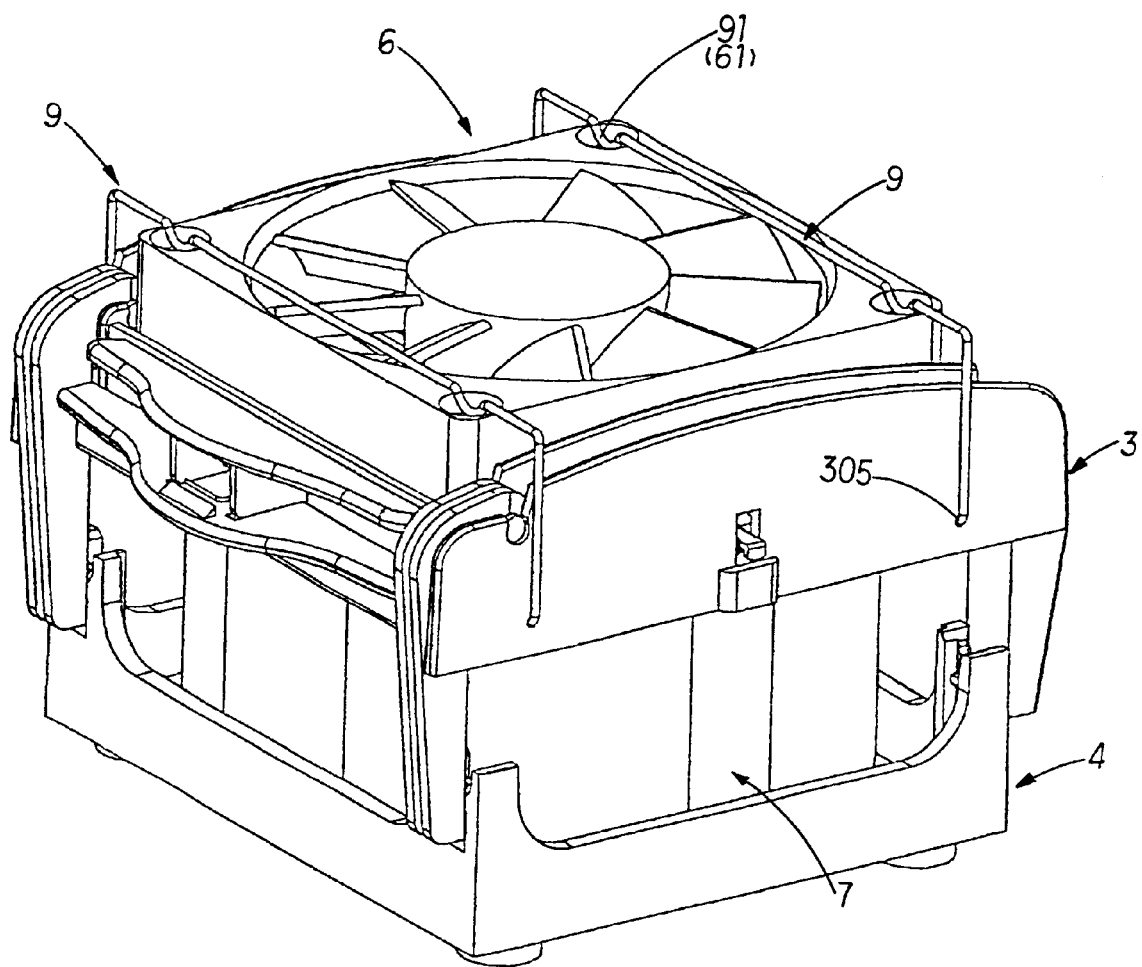
FIG. 19 is similar to FIG. 18 with the elastic retainers in a binding position.

FIG. 17 is an exploded perspective view of the CPU radiator assembly of the present invention adopting the third embodiment of the pressing member 2. The connecting end 26 is wider than the free end 27 and is provided with a through hole 261. The pressing member 2 of this third embodiment is functionally similar to the pressing member 2 of the first embodiment shown in FIG. 20.

Figure 25:
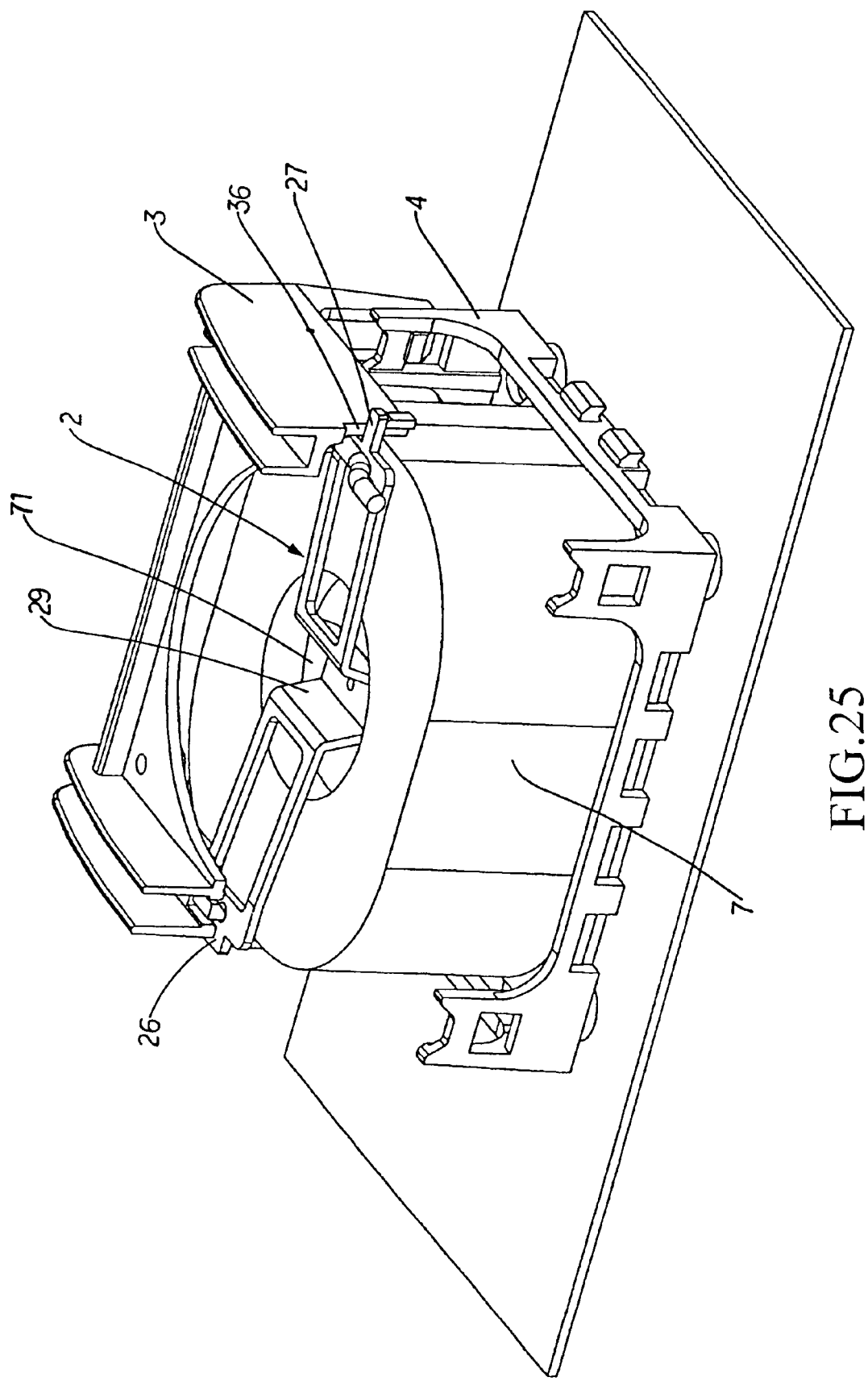
FIG. 25 is a partially cutaway perspective view of the present invention showing the use of the fourth embodiment of the pressing member.
Figure 26:
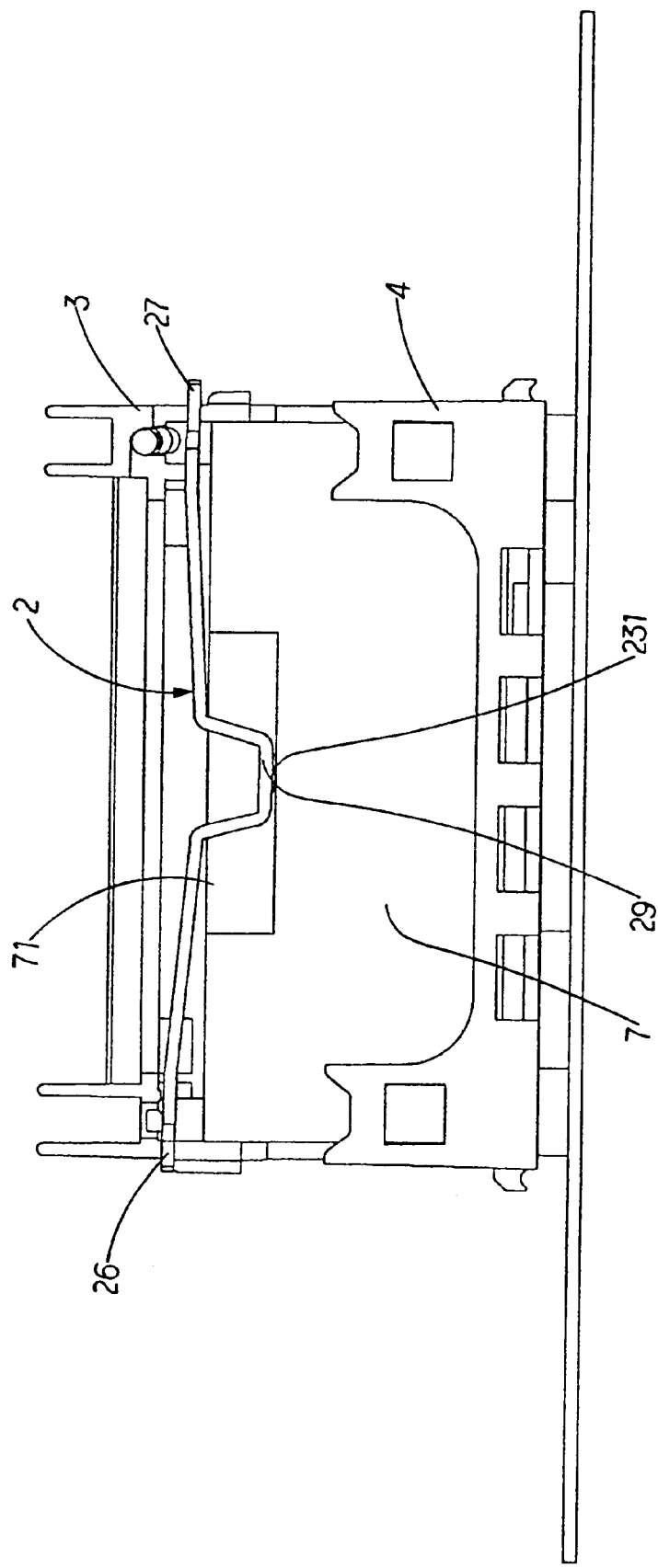
FIG. 26 is a sectional view of FIG. 25.

FIGS. 25 and 26 are partially cutaway perspective view and sectional view, respectively, of the CPU radiator assembly of the present invention adopting the fourth embodiment of the pressing member 2. The radiator block 7 is provided at the top center with a recess 71 corresponding to the downward bent intermediate plate 29, so that the intermediate plate 29 is located in the recess 71 with the downward protrusion 231 tightly contacting with an inner bottom surface of the recess 71 to align with the CPU 81 below the radiator block 7.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A radiator assembly for radiating heat produced by a central processing unit during operation, comprising:
    an upper frame;
    a lower frame connected to said upper frame;
    a radiator block interposed between said upper and said lower frames;
    a pressing member having a connecting end pivotally connected to one side of said upper frame and a free end movably located at another side of said upper frame opposite to said connecting end, so that said pressing member is located between said upper frame and said radiator block to extend across and contact with a top of said radiator block; and
    a control bar mounted onto said upper frame and including forcing means that is manually controllable to apply a downward force on said free end of said pressing member, so that said pressing member pivotally turns about said connecting end to move said free end downward by a predetermined angle and thereby pushes said radiator block and accordingly said lower frame below said radiator block downward opposite to said upper frame, enabling said upper frame to tightly grip said lower frame, and said radiator block to firmly contact with said central processing unit that is located below said radiator block.

2. The radiator assembly for radiating heat produced by a central processing unit as claimed in claim 1, wherein said forcing means on said control bar is an eccentric portion provided on said control bar.

3. The radiator assembly for radiating heat produced by a central processing unit as claimed in claim 1, wherein said control bar is an L-shaped member having a grip portion and a working portion, said forcing means is provided on said working portion, two end portions of said working portion at two sides of said forcing means being pivotally connected to said upper frame, such that said working portion is turnable about its central axis through turning of said grip portion to locate said forcing means at a position for applying a downward force.

4. The radiator assembly for radiating heat produced by a central processing unit as claimed in claim 3, wherein said forcing means on said control bar is an eccentric portion provided on said control bar.

5. The radiator assembly for radiating heat produced by a central processing unit as claimed in claim 3, wherein said upper frame is provided with locating means to hold said control bar to said upper frame after said control bar is turned to locate said forcing means at the position for applying a downward force.

6. The radiator assembly for radiating heat produced by a central processing unit as claimed in claim 5, wherein said locating means include an upper retaining block having an upper bevel surface and a lower retaining block vertically spaced on a wall portion of said upper frame adjacent to said grip portion of said control bar, so that said grip portion is retained between said upper and said lower retaining blocks after being turned.

7. The radiator assembly for radiating heat produced by a central processing unit as claimed in claim 1, wherein said pressing member includes a long beam extended between and interconnecting said connecting end and said free end.

8. The radiator assembly for radiating heat produced by a central processing unit as claimed in claim 7, wherein said long beam of said pressing member is provided with a downward protrusion corresponding to said central processing unit, such that a downward pressure produced by said pressing member is concentrated at said central processing unit.

9. The radiator assembly for radiating heat produced by a central processing unit as claimed in claim 8, wherein said connecting end of said pressing member is a flat plate provided with a through hole and configured to insert into an insertion slot provided on a wall portion of said upper frame, said upper frame being provided on a surface perpendicular to said wall portion having said insertion slot with a downward vertical projection corresponding to said insertion slot, so that said connecting end of said pressing member is inserted into said insertion slot with said through hole engaging with said vertical projection and is located in place through engagement with both said insertion slot and said vertical projection.

10. The radiator assembly for radiating heat produced by a central processing unit as claimed in claim 9, wherein said upper frame is provided on said surface perpendicular to said wall portion having said insertion slot with an opening having an arm extended thereinto, and said vertical projection being formed below a free end of said arm.

11. The radiator assembly for radiating heat produced by a central processing unit as claimed in claim 9, wherein said vertical projection includes a beveled bottom surface to enable said connecting end of said pressing member to easily pass said vertical projection to insert into said insertion slot.

12. The radiator assembly for radiating heat produced by a central processing unit as claimed in claim 10, wherein said vertical projection includes a beveled bottom surface to enable said connecting end of said pressing member to easily pass said vertical projection to insert into said insertion slot.

13. The radiator assembly for radiating heat produced by a central processing unit as claimed in claim 8, wherein said downward protrusion preferably has a round configuration.

14. The radiator assembly for radiating heat produced by a central processing unit as claimed in claim 13, wherein said long beam of said pressing member has a generally n-shaped cross section and includes two opposite longitudinal wall portions, one of which being provided at a predetermined position with an extension portion that is bent to extend across a bottom side of said long beam, and said downward protrusion being formed at a bottom surface of said extension portion; and wherein bottom sides of said long beam at two sides of said extension portion gradually and symmetrically incline upward from said extension portion toward said connecting end and said free end.

15. The radiator assembly for radiating heat produced by a central processing unit as claimed in claim 13, wherein said long beam of said pressing member includes two symmetrical frames connected through an intermediate plate, and wherein said downward protrusion is provided at a bottom of said intermediate plate, said two frames gradually incline upward from two ends of said intermediate plate, and both said connecting end and said free end are in the form of an axially projected flat plate.

16. The radiator assembly for radiating heat produced by a central processing unit as claimed in claim 13, wherein said long beam of said pressing member includes two symmetrical frames connected through an intermediate plate, and wherein both said two frames have an axially extended connecting rib provided therein, said downward protrusion is provided at a bottom of said intermediate plate, said two frames gradually incline upward from two ends of said intermediate plate, and both said connecting end and said free end are in the form of an axially projected flat plate.

17. The radiator assembly for radiating heat produced by a central processing unit as claimed in claim 13, wherein said long beam of said pressing member includes two symmetrical frames connected through an integrally downward bent intermediate plate, and wherein said downward protrusion is provided at a bottom of said integrally downward bent intermediate plate, said radiator block is provided at a top with a recess corresponding to said downward bent intermediate plate for receiving and contacting with said downward bent intermediate plate, said two frames gradually incline upward from two ends of said downward bent intermediate plate, and both said connecting end and said free end are in the form of an axially projected flat plate.

18. The radiator assembly for radiating heat produced by a central processing unit as claimed in claim 13, wherein said long beam of said pressing member includes two symmetrical frames connected through an integrally downward bent intermediate plate, and wherein both said two frames have an axially extended connecting rib provided therein, said downward protrusion is provided at a bottom of said integrally downward bent intermediate plate, said radiator block is provided at a top with a recess corresponding to said downward bent intermediate plate for receiving and contacting with said downward bent intermediate plate, said two frames gradually incline upward from two ends of said downward bent intermediate plate, and both said connecting end and said free end are in the form of an axially projected flat plate.

19. The radiator assembly for radiating heat produced by a central processing unit as claimed in claim 8, wherein said free end of said pressing member is received in a vertically extended elongated stop slot provided at a wall portion of said upper frame opposite to said wall portion having said insertion slot, and said free end of said pressing member being located at an upper end of said stop slot when said control bar is not turned to locate said forcing means at said position for applying a downward force; and said free end of said pressing member being located at a lower end of said stop slot when said control bar is turned to locate said forcing means at said position for applying a downward force.

20. A radiator assembly for radiating heat produced by a central processing unit during operation, comprising an upper frame and a lower frame to sandwich a radiator block between them, said upper frame being connected to said lower frame by means of a pair of first legs and a pair of second legs separately provided at a first and a second low wall portion opposite to each other; said pair of first legs being integrally downward extended from two ends of said first low wall portion, and said pair of second legs being pivotally connected at upper ends to two ends of said second low wall portion, and lower ends of both said first and said second legs being configured to hook onto said lower frame at predetermined positions; said second low wall portion of said upper frame being provided with a fixed lip member, said pair of second legs being connected to each other by a movable lip member extended between said second legs to locate below said fixed lip member; and an elastic supporting means being disposed between said fixed and said movable lip members, such that when an external force is applied on said movable lip member to move the same toward said fixed lip member, said pair of second legs are caused to turn outward about said upper ends to disengage said lower ends of said second legs from said lower frame.

21. The radiator assembly for radiating heat produced by a central processing unit as claimed in claim 20, wherein said upper frame includes opposite first and second high wall portions that together with said first and said second low wall portions forming said upper frame; both said first and said second high wall portions being a two-layer structure including two symmetrical and closely spaced thin walls, and said opposite first and second two-layer high wall portions being provided at positions corresponding to said second low wall portion with two notches for receiving said upper ends of said second legs.

22. The radiator assembly for radiating heat produced by a central processing unit as claimed in claim 20, wherein both said second legs include a vertical section, and said movable lip member being extended between said two vertical sections; said vertical sections of said second legs being provided at lower ends with retaining hooks projected toward an inner side of said upper frame for hooking onto said lower frame at said predetermined positions; and upper ends of said vertical sections of said second legs being extended sideward toward said second low wall portion to form two horizontal sections, and pivotal shafts being provided at free ends of said horizontal sections for pivotally connecting to said upper frame.

23. The radiator assembly for radiating heat produced by a central processing unit as claimed in claim 21, wherein both said second legs are in the shape of an inverted letter L to include an upper horizontal section and a lower vertical section, and pivotal shafts being provided at free ends of said horizontal sections for pivotally connecting to said upper frame, said movable lip member being extended between said two vertical sections at predetermined position, and said vertical sections being provided at lower ends with retaining hooks projected toward an inner side of said upper frame for hooking onto said lower frame at said predetermined positions.

24. The radiator assembly for radiating heat produced by a central processing unit as claimed in claim 23, wherein said notches are provided at upper edges of an end of said opposite first and second two-layer high wall portions adjacent to said second low wall portion, and said pivotal shafts being projected from two sides of said free ends of said horizontal sections corresponding to said two notches.

25. The radiator assembly for radiating heat produced by a central processing unit as claimed in claim 20, wherein said elastic supporting means is an elastic element.

26. The radiator assembly for radiating heat produced by a central processing unit as claimed in claim 25, wherein said elastic element is a torsion spring.

27. The radiator assembly for radiating heat produced by a central processing unit as claimed in claim 25, wherein said elastic element is a torsion leaf spring.

28. The radiator assembly for radiating heat produced by a central processing unit as claimed in claim 25, wherein said elastic element is held between said fixed and said movable lip members by locating means provided on said fixed and said movable lip members.

29. The radiator assembly for radiating heat produced by a central processing unit as claimed in claim 28, wherein said locating means include raised U-shaped frames provided at lower and upper surfaces of said fixed and said movable lip members, respectively.

30. The radiator assembly for radiating heat produced by a central processing unit as claimed in claim 28, wherein said locating means include recesses provided at lower and upper surfaces of said fixed and said movable lip members, respectively.

31. The radiator assembly for radiating heat produced by a central processing unit as claimed in claim 28, wherein said locating means include two symmetrical partitions and an upper front rib between said two partitions downward projected from a lower surface of the fixed lip member, and two symmetrical slots and a lower front rib between said two slots provided on an upper surface of said movable lip member, such that said two partitions are engaged with said two slots to confine said elastic supporting means when said fixed and said movable lip members are pushed toward each other.

32. The radiator assembly for radiating heat produced by a central processing unit as claimed in claim 20, wherein said lower frame is provided at positions corresponding to said first and said second legs of said upper frame with upward extended vertical columns, on which hook holes in the form of recesses or through holes being separately provided; and each said first leg being correspondingly provided at a lower end with an inward projected retaining hook for engaging with said hook holes, and each said second leg also being correspondingly provided at a lower end with an inward projected retaining hook for engaging with said hook holes.

33. A radiator assembly for radiating heat produced by a central processing unit during operation, comprising:
an upper frame;
a lower frame connected to said upper frame;
a radiator block interposed between said upper and said lower frames; and
a pressing member having a connecting end pivotally connected to one side of said upper frame and a free end movably located at another side of said upper frame opposite to said connecting end, so that said pressing member is located between said upper frame and said radiator block to extend across and contact with a top of said radiator block; and said pressing member alone being sufficient to generate a downward force to push said radiator block and accordingly said lower frame below said radiator block in a direction opposite to said upper frame, so as to enable said upper frame to firmly grip said lower frame, and said radiator block to tightly contact with said central processing unit that is located below said radiator block.

34. The radiator assembly for radiating heat produced by a central processing unit as claimed in claim 33, wherein said pressing member includes a long beam extended between and interconnecting said connecting end and said free end.

35. The radiator assembly for radiating heat produced by a central processing unit as claimed in claim 34, wherein said long beam of said pressing member is provided with a downward protrusion corresponding to said central processing unit, such that a downward pressure produced by said pressing member is concentrated at said central processing unit.

36. The radiator assembly for radiating heat produced by a central processing unit as claimed in claim 35, wherein said connecting end of said pressing member is a flat plate provided with a through hole and configured to insert into an insertion slot provided on a wall portion of said upper frame, said upper frame being provided on a surface perpendicular to said wall portion having said insertion slot with a downward vertical projection corresponding to said insertion slot, so that said connecting end of said pressing member is inserted into said insertion slot with said through hole engaging with said vertical projection and is located in place through engagement with both said insertion slot and said vertical projection.

37. The radiator assembly for radiating heat produced by a central processing unit as claimed in claim 36, wherein said upper frame is provided on said surface perpendicular to said wall portion having said insertion slot with an opening having an arm extended thereinto, and said vertical projection being formed below a free end of said arm.

38. The radiator assembly for radiating heat produced by a central processing unit as claimed in claim 36, wherein said vertical projection includes a beveled bottom surface to enable said connecting end of said pressing member to easily pass said vertical projection to insert into said insertion slot.

39. The radiator assembly for radiating heat produced by a central processing unit as claimed in claim 37, wherein said vertical projection includes a beveled bottom surface to enable said connecting end of said pressing member to easily pass said vertical projection to insert into said insertion slot.

40. The radiator assembly for radiating heat produced by a central processing unit as claimed in claim 35, wherein said downward protrusion preferably has a round configuration.

41. The radiator assembly for radiating heat produced by a central processing unit as claimed in claim 40, wherein said long beam of said pressing member has a generally n-shaped cross section and includes two opposite longitudinal wall portions, one of which being provided at a predetermined position with an extension portion that is bent to extend across a bottom side of said long beam, and said downward protrusion being formed at a bottom surface of said extension portion; and wherein bottom sides of said long beam at two sides of said extension portion gradually and symmetrically incline upward from said extension portion toward said connecting end and said free end.

42. The radiator assembly for radiating heat produced by a central processing unit as claimed in claim 40, wherein said long beam of said pressing member includes two symmetrical frames connected through an intermediate plate, and wherein said downward protrusion is provided at a bottom of said intermediate plate, said two frames gradually incline upward from two ends of said intermediate plate, and both said connecting end and said free end are in the form of an axially projected flat plate.

43. The radiator assembly for radiating heat produced by a central processing unit as claimed in claim 40, wherein said long beam of said pressing member includes two symmetrical frames connected through an intermediate plate, and wherein both said two frames have an axially extended connecting rib provided therein, said downward protrusion is provided at a bottom of said intermediate plate, said two frames gradually incline upward from two ends of said intermediate plate, and both said connecting end and said free end are in the form of an axially projected flat plate.

44. The radiator assembly for radiating heat produced by a central processing unit as claimed in claim 40, wherein said long beam of said pressing member includes two symmetrical frames connected through an integrally downward bent intermediate plate, and wherein said downward protrusion is provided at a bottom of said integrally downward bent intermediate plate, said radiator block is provided at a top with a recess corresponding to said downward bent intermediate plate for receiving and contacting with said downward bent intermediate plate, said two frames gradually incline upward from two ends of said downward bent intermediate plate, and both said connecting end and said free end are in the form of an axially projected flat plate.

45. The radiator assembly for radiating heat produced by a central processing unit as claimed in claim 40, wherein said long beam of said pressing member includes two symmetrical frames connected through an integrally downward bent intermediate plate, and wherein both said two frames have an axially extended connecting rib provided therein, said downward protrusion is provided at a bottom of said integrally downward bent intermediate plate, said radiator block is provided at a top with a recess corresponding to said downward bent intermediate plate for receiving and contacting with said downward bent intermediate plate, said two frames gradually incline upward from two ends of said downward bent intermediate plate, and both said connecting end and said free end are in the form of an axially flat projected plate.

46. The radiator assembly for radiating heat produced by a central processing unit as claimed in claim 35, wherein said free end of said pressing member is received in a vertically extended elongated stop slot provided at a wall portion of said upper frame opposite to said wall portion having said insertion slot, and said free end of said pressing member being located at an upper end of said stop slot when said control bar is not turned to locate said forcing means at said position for applying a downward force; and said free end of said pressing member being located at a lower end of said stop slot when said control bar is turned to locate said forcing means at said position for applying a downward force.

47. The radiator assembly for radiating heat produced by a central processing unit as claimed in claim 1, wherein said lower frame is provided on a wall portion with a plurality of vents, so that hot air surrounding said radiator block could be effectively discharged via said a plurality of vents.

48. The radiator assembly for radiating heat produced by a central processing unit as claimed in claim 20, wherein said lower frame is provided on a wall portion with a plurality of vents, so that hot air surrounding said radiator block could be effectively discharged via said a plurality of vents.

49. The radiator assembly for radiating heat produced by a central processing unit as claimed in claim 33, wherein said lower frame is provided on a wall portion with a plurality of vents, so that hot air surrounding said radiator block could be effectively discharged via said a plurality of vents.

* * * * *